(12) United States Patent
Lambert

(10) Patent No.: US 6,917,318 B2
(45) Date of Patent: Jul. 12, 2005

(54) ANALOG TO DIGITAL CONVERTER THAT SERVICES VOICE COMMUNICATIONS

(75) Inventor: Russell H. Lambert, Fountain Valley, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/731,667

(22) Filed: Dec. 9, 2003

(65) Prior Publication Data

US 2004/0119619 A1 Jun. 24, 2004

Related U.S. Application Data

(63) Continuation of application No. 10/230,692, filed on Aug. 29, 2002, now Pat. No. 6,661,360.
(60) Provisional application No. 60/356,323, filed on Feb. 12, 2002, and provisional application No. 60/402,855, filed on Aug. 12, 2002.

(51) Int. Cl.[7] .............................................. H03M 1/20
(52) U.S. Cl. ..................................... 341/131; 341/110
(58) Field of Search ................................ 341/131, 144, 341/155, 110; 375/22, 254; 370/292, 276, 352, 286; 379/442, 399.1, 406.08

(56) References Cited

U.S. PATENT DOCUMENTS

| | | | | |
|---|---|---|---|---|
| 5,189,418 A | * | 2/1993 | Bartz et al. ................. | 341/131 |
| 5,349,701 A | * | 9/1994 | Lobel ......................... | 455/222 |
| 6,301,366 B1 | * | 10/2001 | Malcolm et al. ........... | 381/119 |
| 6,522,688 B1 | * | 2/2003 | Dowling ..................... | 375/222 |
| 6,661,360 B2 | * | 12/2003 | Lambert ..................... | 341/131 |

* cited by examiner

Primary Examiner—Brian Young
(74) Attorney, Agent, or Firm—Garlick, Harrison & Markison; Bruce Garlick

(57) ABSTRACT

An Analog-to-Digital-Converter (ADC) converts an analog signal to digital data. The ADC includes a modulator, a decimation filter, and a time dither clock reduction circuit. The modulator receives the analog signal and a feedback signal and, based there upon, produces a modulated signal at a modulator clock rate. The decimation filter couples to the modulator, receives the modulated signal, and decimates and filters the modulated signal to produce the digital data. The time dither clock reduction circuit receives the modulated signal and provides the feedback signal to the modulator. The time dither clock reduction circuit applies both clock reduction and time dithering to the modulated signal to produce the feedback signal. At each modulator clock cycle, the time dithering clock reduction circuit considers modulated signals for a dithering factor, N, previous modulator clock cycles and a modulated signal for a current modulator clock cycle. If at least one constraint is satisfied for the N previous modulator clock cycles, the time dithering clock reduction circuit is allowed to transition the feedback signal with the modulated signal. If not, the time dithering clock reduction circuit holds the prior value of the feedback signal. After a transition, a new dithering factor may be determined. The ADC may be contained in a wireless local area network (WLAN) transceiving integrated circuit that services voice communications in a WLAN with at least one other WLAN device.

20 Claims, 19 Drawing Sheets

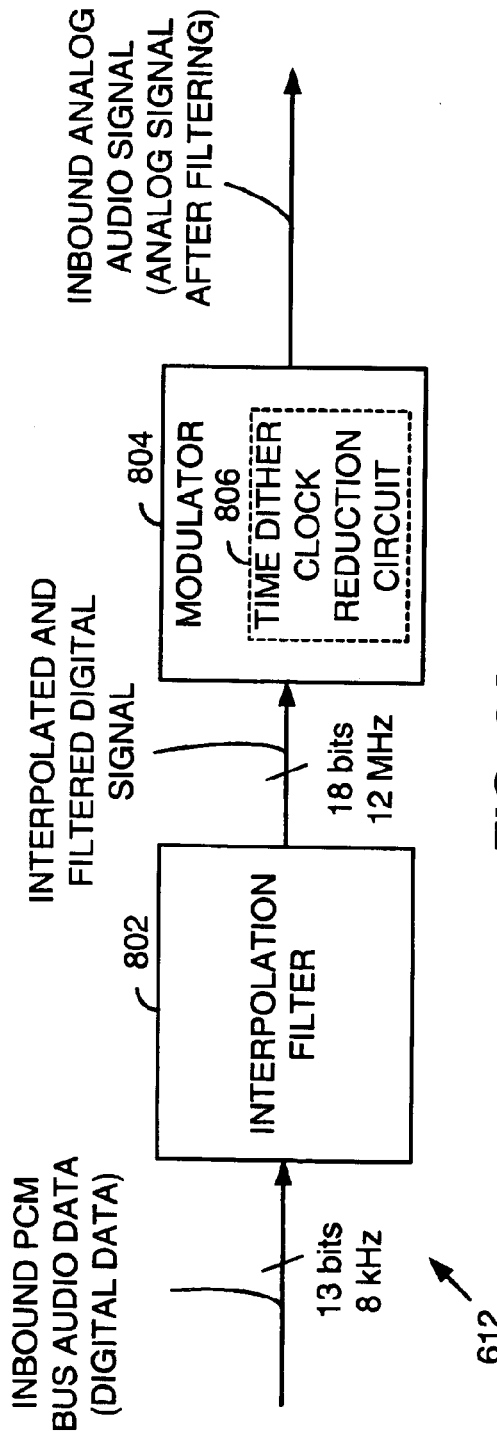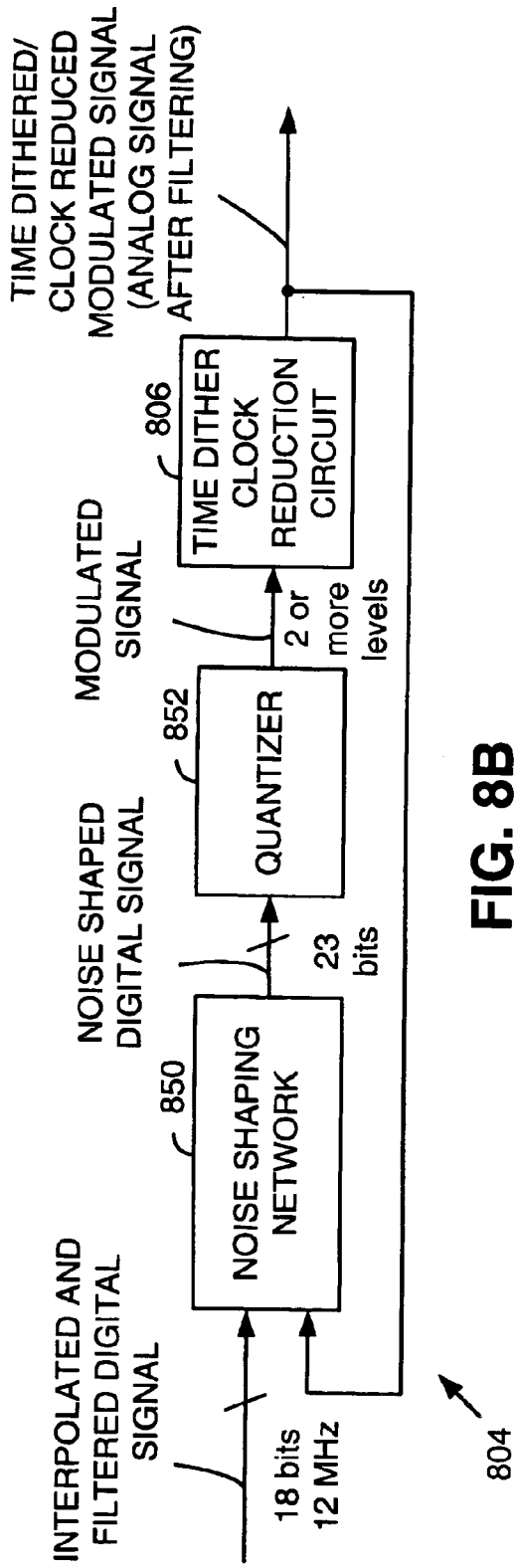

a digital audio signal. During this conversion process, the ADC may introduce "tones" that are a byproduct of the sampling characteristics of the ADC. Likewise, the DAC receives a digital audio signal and converts the digital audio signal to an analog audio signal that it applies to coupled to a speaker. During this conversion process, the DAC may introduce "tones" to the analog audio signal that are a byproduct of the conversion process. These "tones," while having a relatively small magnitude compared to an active signal are noticeable during "quiet" times. In the case of the ADC, "quiet" times exist when no input is provided to the microphone. In the case of the DAC, "quiet" times exist when data is lost or when incoming data contains no audio data.

ANALOG TO DIGITAL CONVERTER THAT SERVICES VOICE COMMUNICATIONS

CROSS REFERENCE TO RELATED APPLICATION

This application is a continuation of and claims priority to U.S. application Ser. No. 10/230,692, filed Aug. 29, 2002, issued on Dec. 9, 2003 as U.S. Pat. No. 6,661,360, which claims priority to U.S. Provisional Application Ser. No. 60/356,323, filed Feb. 12, 2002, and to U.S. Provisional Application Ser. No. 60/402,855, filed Aug. 12, 2002, the disclosure of all incorporated herein by reference in their entirety.

FIELD OF THE INVENTION

The present invention relates to communications; and more particularly to signal conversion in wireless communication devices that service voice communications.

BACKGROUND OF THE INVENTION

The number and popularity of wireless communications devices in use continues to rise rapidly all over the world. Not only have cellular telephones become very popular, but Wireless Local Area Networking (WLAN) devices have also proliferated. One standard for wireless networking, which has been widely accepted, is the Specification of the Bluetooth System, v. 1.0 ("Bluetooth Specification"). The Bluetooth Specification enables the creation of small personal area networks (PAN's), where the typical operating range of a device is 100 meters or less. In a Bluetooth system, Bluetooth devices sharing a common channel sequence form a piconet. Two or more piconets co-located in the same area, with or without inter-piconet communications, is known as a scatternet.

The Bluetooth Specification supports voice communications between Bluetooth enabled devices. When a pair of Bluetooth devices support voice communication, the voice communications must be wirelessly supported in a continuous fashion so that carried voice signals are of an acceptable quality. Unexpected gaps, e.g., dropped packets, on the wireless link between supported Bluetooth devices causes degradation in the voice communication resulting in popping, static, or other unpleasant audible event. This problem is especially troublesome with Bluetooth devices since, in some operations, the communication link will regularly drop packets that carry the voice signals.

A further shortcoming of such operations relates to the manner in which packetized audio data is transmitted between Bluetooth devices. Consider an operation in which a first Bluetooth device transmits packetized audio data to a second Bluetooth device for presentation to a user. Because the Bluetooth WLAN supports data rates greatly in excess of those required for satisfactory voice service, each transmission from the first Bluetooth device carries a relatively large amount of packetized audio data. The duration of this transmission is typically small compared to the duration over which the second Bluetooth device will present the packetized audio data (carried in the transmission) to the user. Thus, the second Bluetooth device buffers the received packetized audio data and presents the packetized audio data (in a converted form) over an appropriate time period. However, if the packetized audio data stored in the input buffer is fully consumed prior to receipt of another transmission from the first Bluetooth device, it will appear to the second Bluetooth device that packetized audio data is lost (or severely delayed), and the second Bluetooth device will provided degraded audio to the serviced user.

Particular operational details occur during "quiet" times in the operation of wireless devices servicing voice communications. In particular, Bluetooth (and other wireless) devices that service voice communications (via packetized audio data) include Analog to Digital Converters (ADCs) and Digital to Analog Converters (DACs). The ADC of the wireless device receives an analog audio signal from a coupled microphone and converts the analog audio signal to Thus, there is a need for improved ADC and DAC operations for devices that serviced packetized voice communications.

SUMMARY OF THE INVENTION

In order to overcome the shortcomings of the prior Analog-to-Digital Converters (ADCs), an ADC constructed according to the present invention receives an analog signal and that converts the analog signal to digital data. The ADC includes a modulator, a decimation filter, and a time dither clock reduction circuit. The modulator receives the analog signal and a feedback signal and, based there upon, produces a modulated signal at a modulator clock rate. The decimation filter couples to the modulator, receives the modulated signal, and decimates and filters the modulated signal to produce the digital data. The time dither clock reduction circuit receives the modulated signal and provides the feedback signal to the modulator. The time dither clock reduction circuit applies both clock reduction and time dithering to the modulated signal to produce the feedback signal.

According to the present invention, at each modulator clock cycle, the time dithering clock reduction circuit considers modulated signals for a dithering factor, N, previous modulator clock cycles and a modulated signal for a current modulator clock cycle. If at least one constraint is satisfied for the N previous modulator clock cycles, the time dithering clock reduction circuit is allowed to transition the feedback signal with the modulated signal. If not, the time dithering clock reduction circuit holds the prior value of the feedback signal.

In a first particular operation, if the prior feedback signal is one, a sum of the modulated signals for the N previous modulator clocks is equal to N, the modulated signal for the current modulator clock is zero, and the time dithering clock reduction circuit transitions the feedback signal from one to zero. In a second particular operation, if the prior feedback signal is one, a sum of the modulated signals for the N previous modulator clocks is equal to N, the modulated signal for the current modulator clock is one, and the time dithering clock reduction circuit holds the feedback signal at one. In a third particular operation, if the prior feedback signal is zero, a sum of the modulated signals for the N previous modulator clocks is equal to zero, the modulated signal for the current modulator clock is one, and the time dithering clock reduction circuit transitions the feedback signal from zero to one. In a fourth particular operation, if the prior feedback signal is zero, a sum of the modulated signals for the N previous modulator clocks is equal to zero, the modulated signal for the current modulator clock is zero, and the time dithering clock reduction circuit holds the feedback signal at zero. These operations are varied slightly when the modulator is capable of producing more than two different outputs, e.g., −1, 0, and 1.

After the time dithering clock reduction circuit is allowed to transition the feedback signal with the modulated signal, a new dithering factor, N, may be selected. In one particular operation for generating a new dithering factor, a random number is generated. The new dithering factor is based upon a comparison of the random number to at least one constraint.

The ADC of the present invention may be contained within a wireless local area network (WLAN) transceiving integrated circuit that services voice communications in a WLAN with at least one other WLAN device. The WLAN transceiving integrated circuit, in one embodiment, is formed as a single monolithic integrated circuit. Herein, the terms "audio communications" and "voice communications" are both be used to refer to communications that contain information based upon audio signals that originate from or that are presented to a user in an audio format. Of course, the voice/audio communications need not be received directly from a human but may be generated by electronic equipment such as computers, media players, etc.

The WLAN transceiving integrated circuit may operate consistently with the Bluetooth Specification or with another standard, e.g., IEEE 802.11(a), IEEE 802.11(b), IEEE 802.11(c), etc. When the WLAN transceiving integrated circuit operates within a Bluetooth WLAN, the WLAN transceiving integrated circuit supports the Bluetooth Specification. In such case, the WLAN transceiving integrated circuit transmits packetized audio data to other Bluetooth devices and receives packetized audio data from other Bluetooth devices.

With the time dithering and clock reduction operations of the present invention, single modulator clock cycle resolution is maintained at the output of the time dither clock reduction circuit. Single modulator clock cycle resolution at the output of the ADC causes the modulator to better track the analog input signal. Further, by limiting the transitions of the time dither clock reduction circuit, power consumption of the ADC is reduced. Moreover, by adding time dithering, the ADC produces less output noise in the form of tones, i.e., frequencies corresponding to a fixed clock reduction operation. Reduction in output noise also lowers Electromagnetic Interference to address FCC and radio issues.

Other features and advantages of the present invention will become apparent from the following detailed description of the invention made with reference to the accompanying drawings.

BRIEF DESCRIPTION OF THE DRAWINGS

FIG. 8A is block diagram illustrating the components of a Digital-to-Analog Converter (DAC) of the CODEC of FIG. 6 that is constructed according to the present invention;

FIG. 8B is block diagram illustrating in more detail the modulator of the DAC of FIG. 8A according to one embodiment of the present invention;

DETAILED DESCRIPTION

Figure 1:
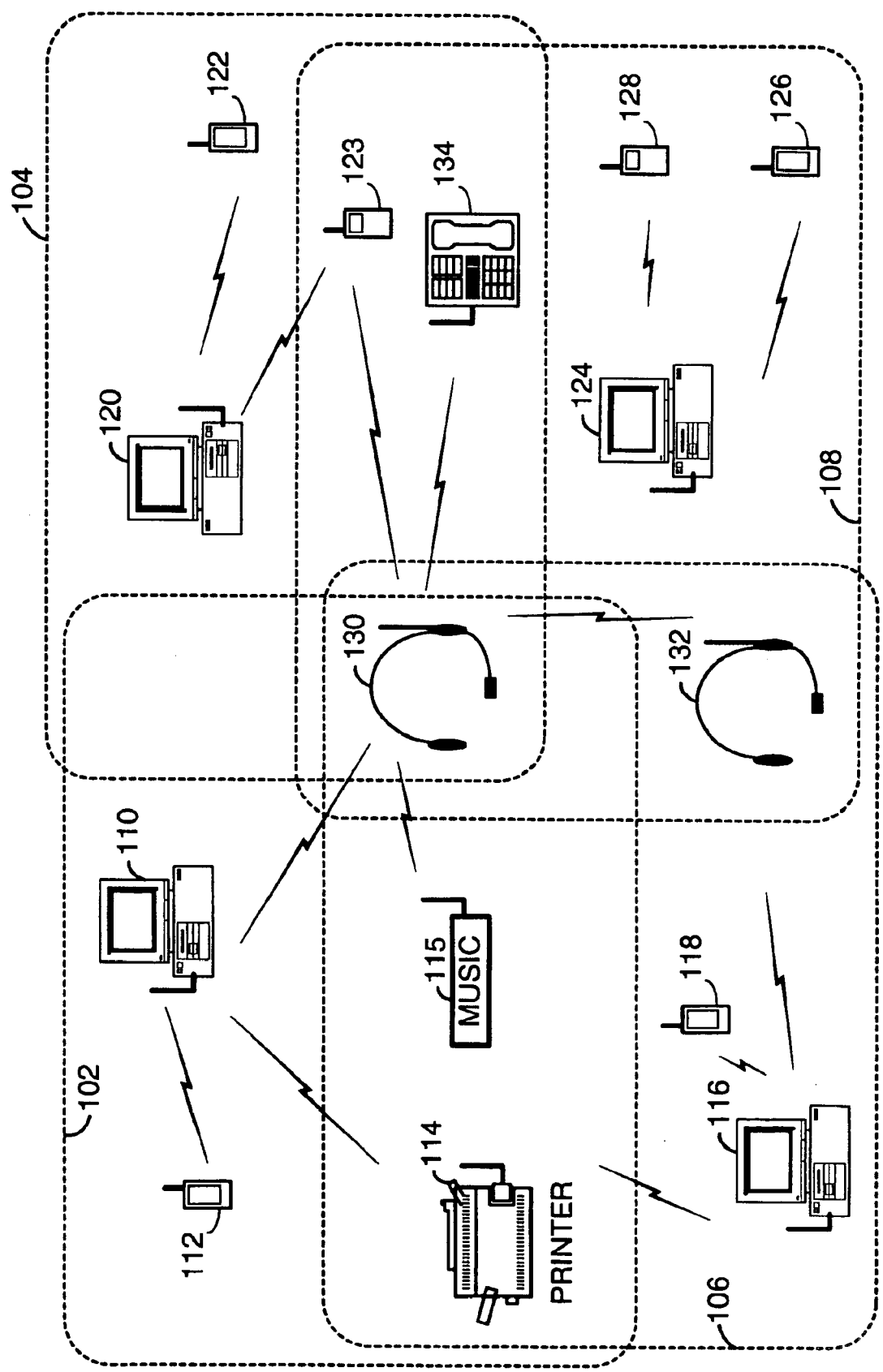
FIG. 1 is a system diagram illustrating a plurality of Wireless Local Area Network (WLAN) devices, some of which have installed therein WLAN transceiving integrated circuit constructed according to the present invention.

FIG. 1 is a system diagram illustrating a plurality of Wireless Local Area Network (WLAN) devices, some of which have installed therein WLAN transceiving integrated circuit constructed according to the present invention. Each of these WLAN devices supports one or more versions of the Bluetooth Specification. A Bluetooth "scatternet" is formed from multiple "piconets" with overlapping coverage. The scatternet of FIG. 1 includes four separate piconets 102, 104, 106, and 108. Piconet 102 includes master (computer) 110, slave 112 (PDA), slave 114 (printer), slave 130 (wireless headset), and slave 115 (music source). Piconet 104 includes master 120 (computer), slave 122 (PDA), slave 123 (wireless phone), slave 130 (wireless headset), and slave 134 (landline phone). Piconet 106 includes master (computer) 116, slave 118 (PDA), slave 114 (printer), slave 130 (wireless headset), and slave 132 (wireless headset). Piconet 108 includes master (computer) 124, slave 126 (PDA), slave 128 (wireless phone, e.g., WLAN phone, cell phone, etc.), slave 132 (wireless headset), and slave 130 (wireless headset). The four separate piconets 102, 104, 106, and 108 have overlapping coverage areas. In the embodiment of FIG. 1, all masters are shown to be computers because they will typically be stationary and have the processing capability to service a number of slaves. However, in other embodiments, the masters could be other devices as well. The scatternet of FIG. 1 may service a call center, customer service department, or other office environment, for example that benefits by the wireless interconnection of the illustrated devices.

A user of wireless headset 130 (or 132) may establish communications with any WLAN device in a piconet of which the wireless headset 130 (or 132) is also a member. The wireless headset 130 may have a minimal user interface, e.g., a single authenticate button that initiates joining of a piconet. However, the wireless headset 130, in its operating location, resides within the service coverage area of each of the four separate piconets 102, 104, 106, and 108 that form the scatternet. Thus, when the wireless headset 130 enters (or powers up in) an area with more than one functioning piconet, a user of the wireless headset 130 depresses an authenticate button to start the authentication process. With the authenticate button depressed, the wireless headset attempts to join one of piconets 102, 104, 106, and 108. Subsequent authentication operations are required to have the wireless headset join the selected piconet. These subsequent authentication operations may include prompting the user for selection of the piconet, requiring that entry be made on the home computer 110 to allow the wireless headset 130 to join the piconet 102, or other authentication operations. Likewise, the wireless headset 132 joins piconet 106 by performing appropriate authentication operations with master (computer 116) of piconet 106.

Once a wireless headset, e.g., 130 or 132 joins a respective piconet, 102 or 106, the wireless headset establishes an audio link with one or more of the members of the piconet via respective WLAN links. In particular, when the wireless headset 130 serves within a call center of FIG. 1, for example, an attendant using the wireless headset 130 services calls of the call center. Such calls will be received and managed by the computer 110 in the example. Likewise, the user of wireless headset 132 will work in conjunction with the computer 116 to service calls for the call center.

Each of the WLAN devices illustrated in FIG. 1 may include a WLAN transceiving integrated circuit constructed according to the present invention. As will be described further herein with reference to FIGS. 3A–10, the WLAN transceiving integrated circuit gracefully operates when RF slots of a transmitting WLAN device servicing as a master of a piconet are not synchronized with the other operations of the WLAN transceiving integrated circuit. According to the present invention, PCM audio data that is produced by the WLAN transceiving integrated circuit based upon received packetized audio data is substantially temporally aligned with RF slots of the transmitting WLAN device. Thus, with the present invention, the WLAN device at the same rate consumes packetized audio data as it is received from the transmitting WLAN device. Thus, the PCM audio data output does not surge ahead of, or lag behind, the packetized audio data that is received from the transmitting WLAN device.

Figure 2A:
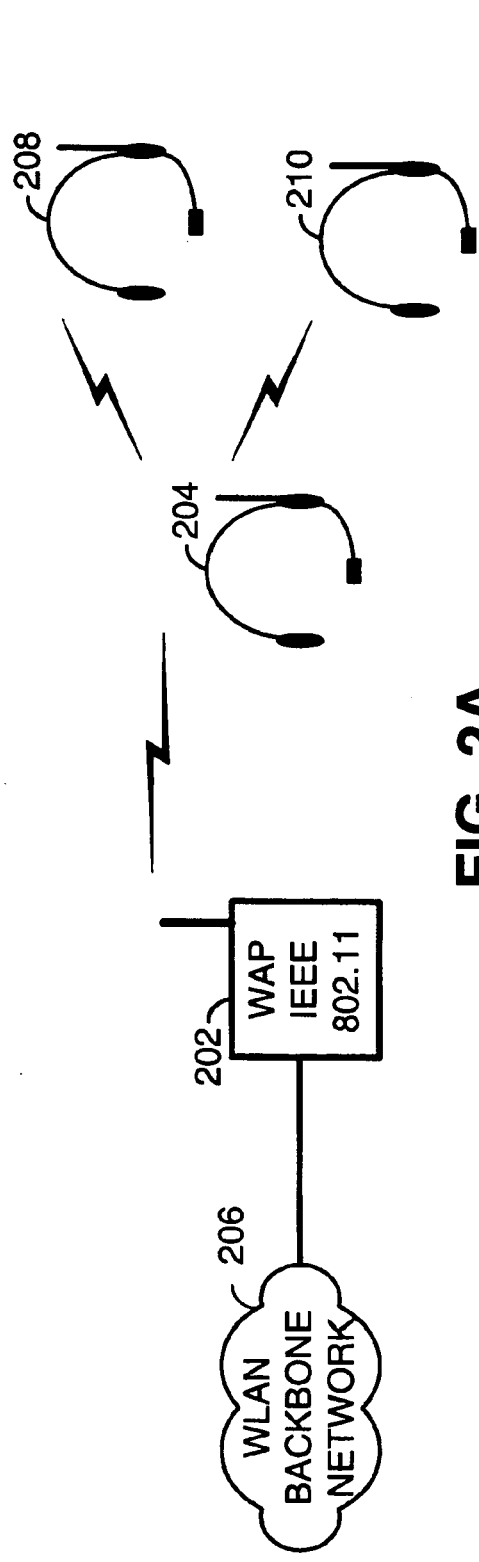
FIG. 2A is a system diagram illustrating the interaction between a plurality of WLAN devices constructed according to the present invention and a Wireless Access Point (WAP)

FIG. 2A is a system diagram illustrating the interaction between a plurality of WLAN devices 204, 208, and 210 constructed according to the present invention and a Wireless Access Point (WAP) 202. In the embodiment of FIG. 2A, the wireless headset 204 is Bluetooth compliant and/or IEEE 802.11 compliant, e.g., IEEE 802.11a, IEEE 802.11b, IEEE 802.11g, etc. In such case, the wireless headset 204 establishes a voice communication via the WAP 202 with another device also serviced by the WAP 202, or, more likely, with another device couple to the WAP 202 via the Wireless Local Area Network (WLAN) backbone network 206. Further, the wireless headset 204 services voice communications with two additional wireless headsets 208 and 210.

Figure 2B:
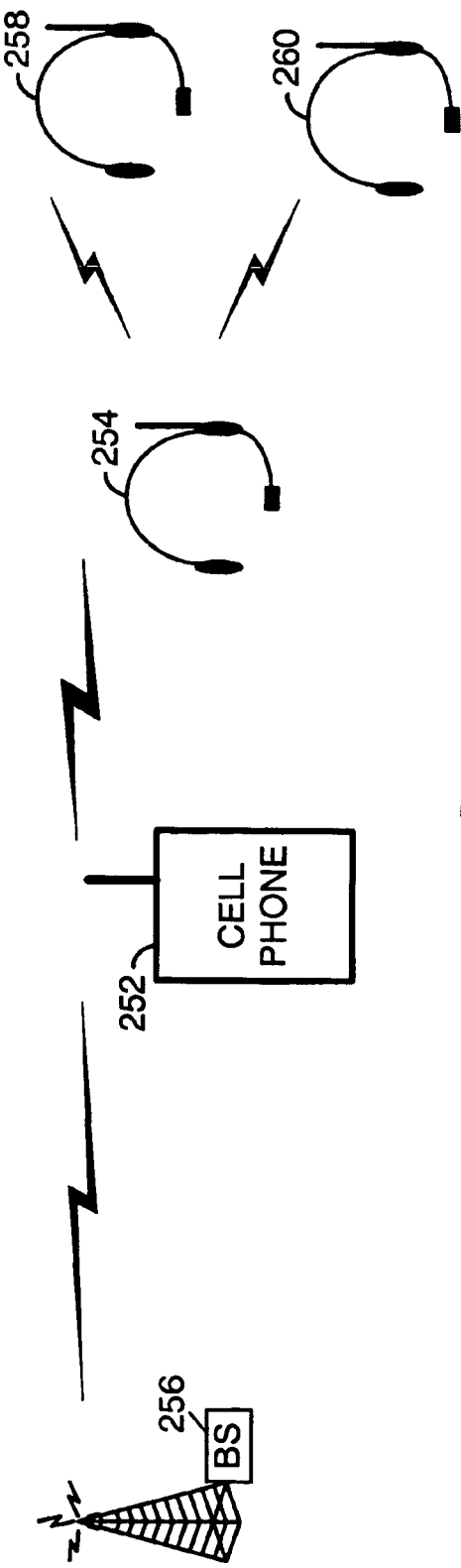
FIG. 2B is a system diagram illustrating the interaction between wireless headsets, a cell phone, and a cellular base station according to the present invention.

FIG. 2B is a system diagram illustrating the interaction between wireless headsets 254, 258, and 260, a cell phone 252, and a cellular base station 256. The cell phone 252 establishes a cellular telephone call via the base station 256 with another wireless device or with a wired device that couples to the base station 256 via a wired connection. The cell phone 252 operates according to a cellular operating standard, e.g., IS-95A, IS-95B, IS-136, GSM, 1×RTT, 1×EV, UMTS, etc. The cell phone 252 also supports the Bluetooth specification and communications with the wireless headset 254 via Bluetooth operations. The wireless headset 254 supports communications with wireless headsets 258 and 260 also via the Bluetooth operations. Thus, for example, the user of the wireless headset 254, while operating a vehicle may use the wireless headset 254 for audio communications serviced by the cell phone 252. However, usage of the components of FIG. 2B is not limited to a vehicular application. Further, in order to support call conferencing, the wireless headset 254 supports conferencing with wireless headsets 258 and 260.

Figure 3A:
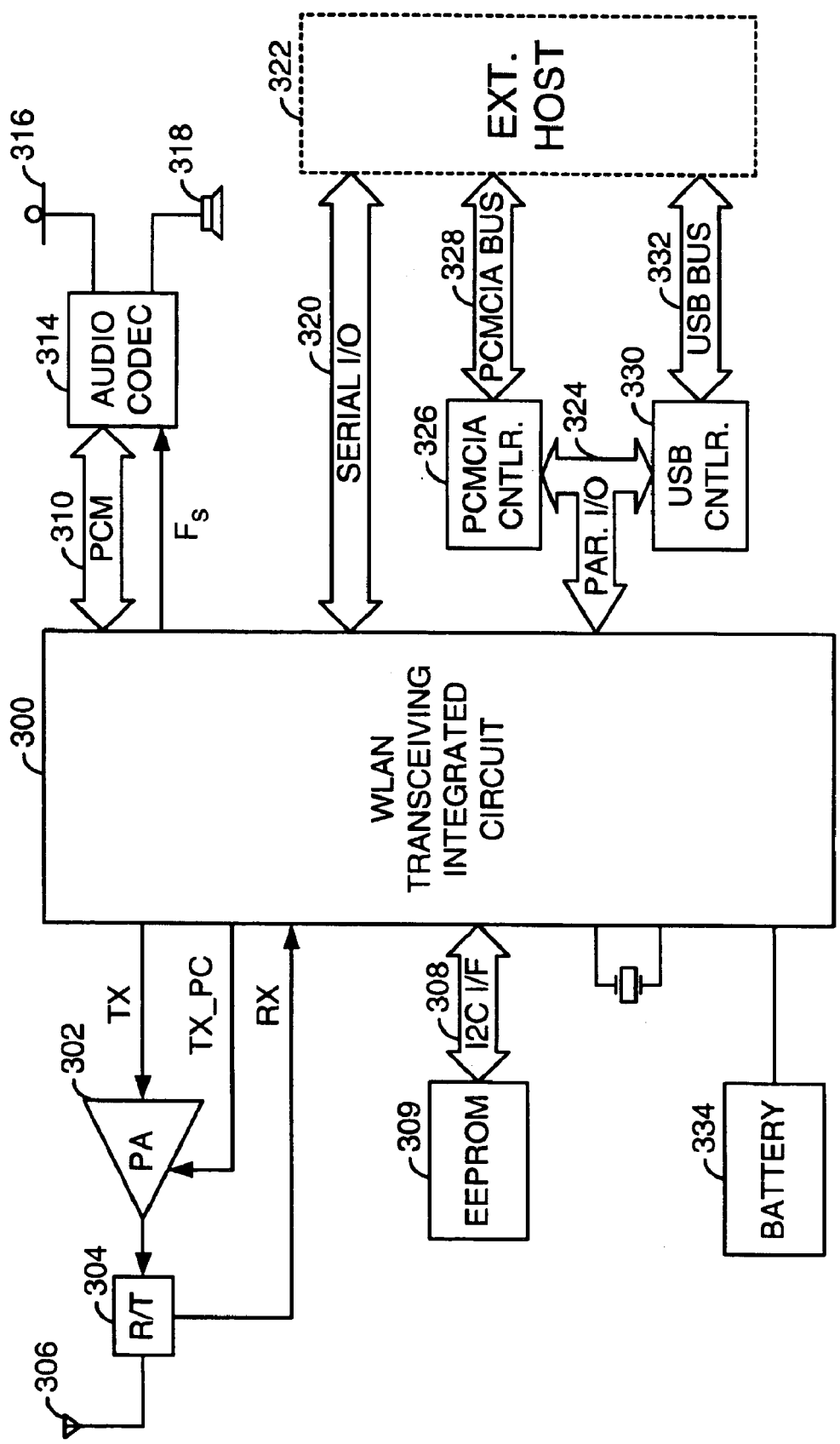
FIG. 3A is a block diagram illustrating the electrical components of a wireless headset that includes a first embodiment of a WLAN transceiving integrated circuit constructed according to the present invention.

FIG. 3A is a block diagram illustrating the electrical components of a wireless headset that includes a first embodiment of a WLAN transceiving integrated circuit constructed according to the present invention. The wireless headset includes the WLAN transceiving integrated circuit 300 and a number of supporting components. The Radio Frequency (RF) interface for the WLAN transceiving integrated circuit 300 includes a Power Amplifier (PA) 302, a Receive/Transmit switch 304, and an antenna 306. The power supply for wireless headset is a battery 334 that couples to the WLAN transceiving integrated circuit 300 and also couples to other components of the wireless headset. The WLAN transceiving integrated circuit 300 includes a plurality of interfaces that adhere to standardized interface formats. These interfaces include an I2C interface 308 that may couple the WLAN transceiving integrated circuit 300 to an EEPROM 309. A Pulse Code Modulated (PCM) connection 310 couples the WLAN transceiving integrated circuit 300 to an audio Coder-Decoder (CODEC) 314 that performs coding/decoding operations. The PCM connection 310 includes a PCM synchronization signal, $F_S$. The audio CODEC 314 couples to a microphone 316 and to a speaker 318.

A serial I/O 320 may couple the WLAN transceiving integrated circuit 300 to an external host 320. However, in the embodiment of FIG. 3, the wireless headset does not require an external host 320. A parallel I/O 324 may couple the WLAN transceiving integrated circuit 300 to a PCMCIA controller 326 and to a USB controller 330 that my also couple the WLAN transceiving integrated circuit 300 to the external host 320 via a PCMCIA bus 328 and a USB bus 332, respectively.

Figure 3B:
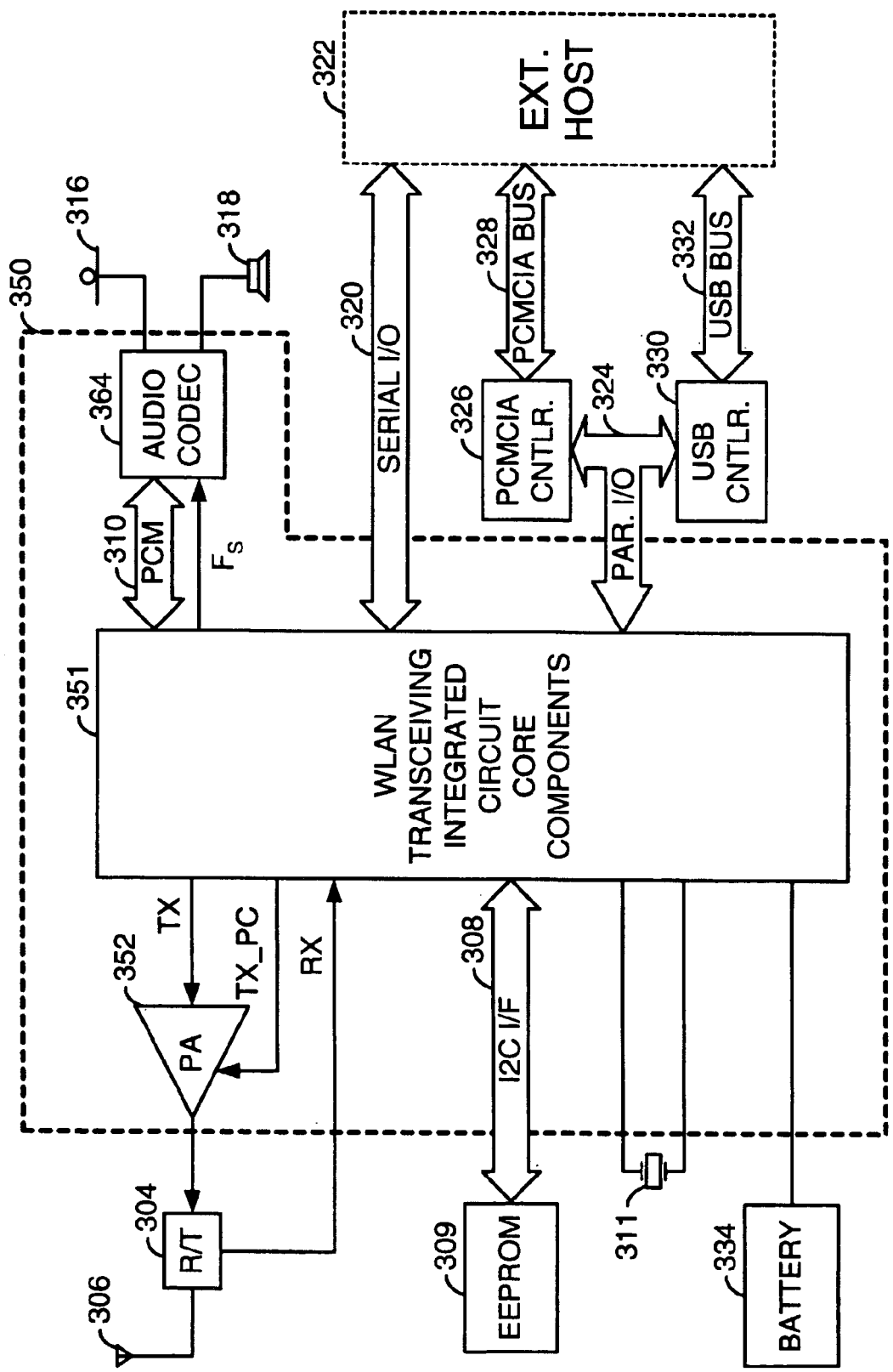
FIG. 3B is a block diagram illustrating the electrical components of a wireless headset that includes a second embodiment of a WLAN transceiving integrated circuit constructed according to the present invention.

FIG. 3B is a block diagram illustrating the electrical components of a wireless headset that includes a second embodiment of a WLAN transceiving integrated circuit constructed according to the present invention. The embodiment of FIG. 3B is similar to the embodiment of FIG. 3A except that the embodiment of FIG. 3B includes additional integration. With such integration, the PA 352 and audio CODEC 364 are on-chip and the remaining components of the WLAN transceiving integrated circuit are referred to as WLAN transceiving integrated circuit core components 351. In still another embodiment, the WLAN transceiving integrated circuit includes an on-chip local oscillator and does not require an external crystal to provide a reference oscillation 311.

Figure 4A:
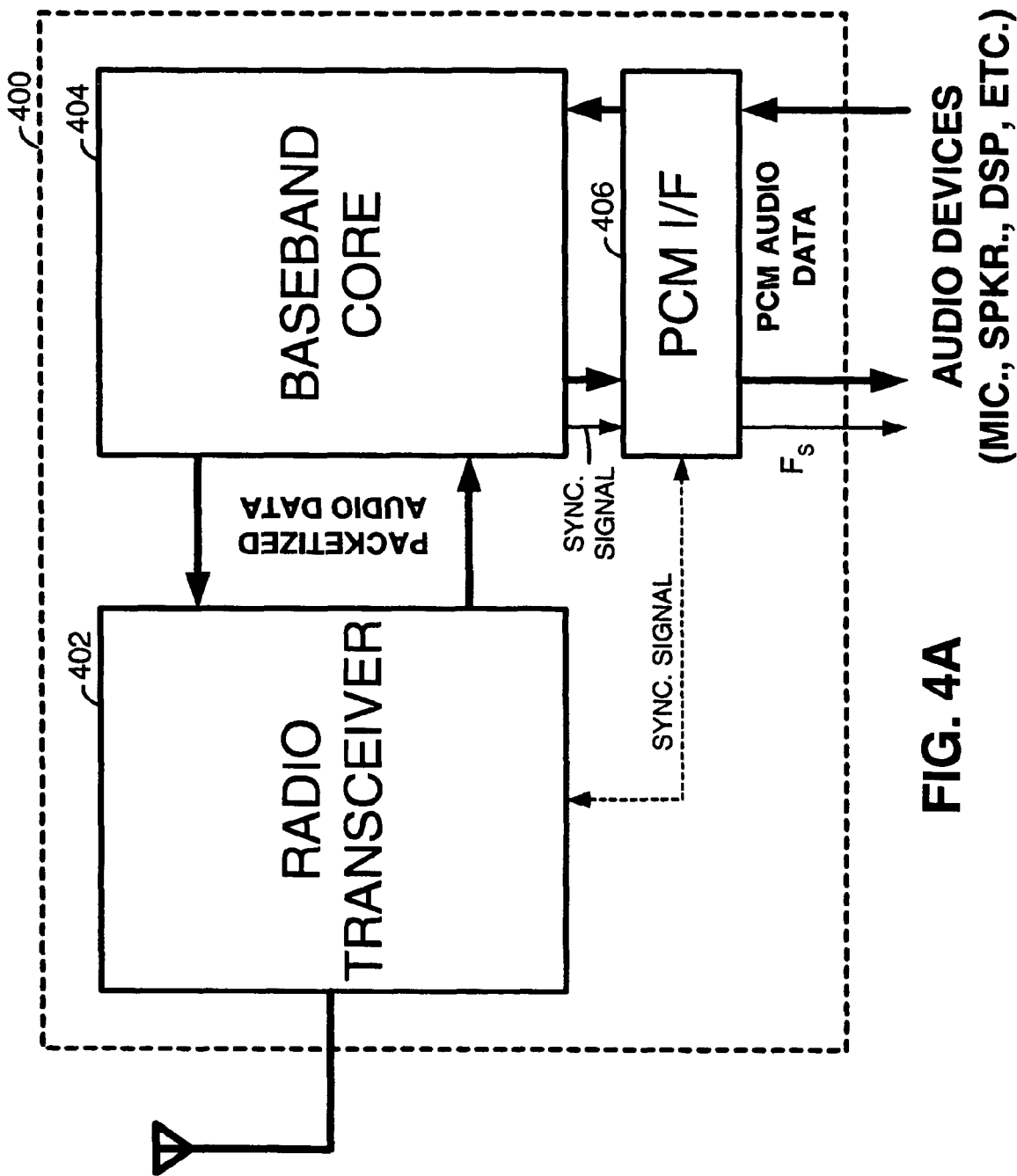
FIG. 4A is a block diagram generally illustrating the components of a WLAN transceiving integrated circuit constructed according to the present invention.

FIG. 4A is a block diagram generally illustrating the components of a WLAN transceiving integrated circuit constructed according to the present invention. The baseband processor 400 includes a radio transceiver 402, a baseband core (BBC) 404, and a PCM interface 406. The WLAN transceiving integrated circuit 400 shown in FIG. 4A has an integrated radio transceiver 402 that has been optimized for use in 2.4 GHz Bluetooth wireless systems.

The BBC 404 implements the physical layer of the Bluetooth interface with other Bluetooth enabled WLAN devices. The BBC 404 manages physical channels and links apart from other services like error correction, data whitening, hop selection and Bluetooth security. The BBC 404 implements the physical layer lies on top of the Bluetooth radio layer in the Bluetooth protocol stack. The baseband protocol is implemented as a Link Controller, which works with the link manager for carrying out link level routines like link connection and power control. The BBC 404 also manages asynchronous and synchronous links, handles packets and does paging and inquiry to access and inquire Bluetooth devices in the area. The baseband transceiver 400 applies a time-division duplex (TDD) scheme (alternate transmit and receive). Therefore apart from different hopping frequency (frequency division), the time is also slotted.

The BBC 404 supports 13 different packet types for the baseband layer of the Bluetooth system. All higher layers use these packets to compose higher level PDU's. The packets are ID, NULL, POLL, FHS, and DM1. These packets are defined for both SCO and ACL links. DH1, AUX1, DM3, DH3, DM5, DH5 packets are defined for ACL links only. HV1, HV2, HV3, and DV packets are defined for SCO links only. Each Bluetooth packet consists of 3 entities, an access code (68/72 bits), a header (54 bits), and a payload (0–2745 bits). The Access code is used for tiring synchronization, offset compensation, paging and inquiry. There are three different types of Access codes: (1) the Channel Access Code (CAC); (2) the Device Access Code (DAC); and (3) the Inquiry Access Code (IAC). The channel access code identifies a unique piconet while the DAC is used for paging and its responses. The IAC is used for inquiry purpose. The header contains information for packet acknowledgement, packet numbering for out-of-order packet reordering, flow control, slave address and error check for header. Finally, the Payload contains a voice field, a data field or both. If the payload is a data field, the payload will also contain a payload header. In supporting voice communications, packetized audio data is carried between WLAN devices in Bluetooth Specification Synchronous Connection Oriented (SCO) data packets.

The PCM I/F 406 couples to the baseband core 404 and produces PCM audio data and also a PCM synchronization signal, $F_S$. According to the present invention, the PCM synchronization signal, $F_S$ is temporally aligned with RF slots of the radio transceiver 402 that are produced by a servicing master WLAN device. The PCM I/F 406 may receive the PCM synchronization signal, $F_S$, directly from the baseband core 404 or may construct the PCM synchronization signal, $F_S$, based upon a synchronization signal received from either/both of the radio transceiver 402 or/and the baseband core 404.

Figure 4B:
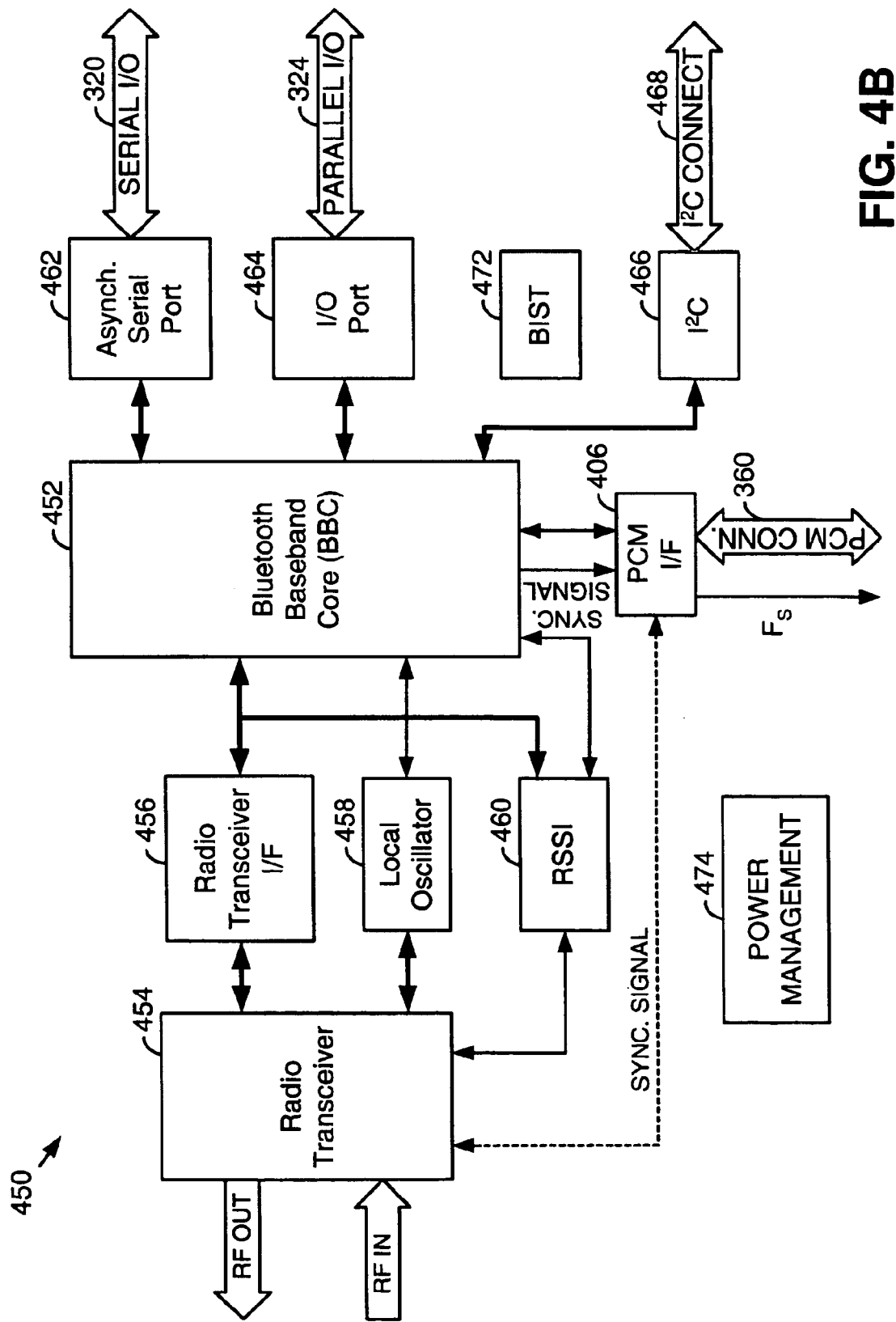
FIG. 4B is a block diagram generally illustrating in more detail the components of the WLAN transceiving integrated circuit constructed according to the present invention of FIG. 4A.

FIG. 4B is a block diagram generally illustrating in more detail the components of the WLAN transceiving integrated circuit 450 constructed according to the present invention of FIG. 4A. The radio transceiver 454 has been designed to provide low-power, low-cost, robust communications for applications operating in the globally available 2.4 GHz unlicensed ISM band. It is fully compliant with the Bluetooth RF specification Version 1.1 and meets or exceeds the requirements to provide the highest communication link quality service. In the receiver path, the radio transceiver 454 has a high-degree of linearity, an extended dynamic range, and high order on-chip channel filtering to ensure reliable operation in the noisy 2.4 GHz ISM band. The performance of the receiver chain is reflected in the IP3, co-channel interference, and out-of-band blocking specifications. The radio transceiver 402 includes a fully integrated transmitter. Baseband data received from the baseband core 404 is GFSK modulated and up-converted to the 2.4 GHz ISM band via an internal mixer. The radio transceiver 454 provides a normal power output of 0 dBm and has a power control signal provided by the WLAN transceiving integrated circuit 300 that controls the PA 302 to provide 24 dBm of gain control in 8 dBm step size.

The radio transceiver 454 interfaces with the BBC 452 via a radio transceiver interface 456, a Local Oscillator (LO) 458, and a Received Signal Strength Indicator (RSSI) 460. The LO 458 provides fast frequency hopping (1600 hops/second) across the 79 maximum available Bluetooth channels. The radio transceiver 454 of the WLAN transceiving integrated circuit 400 features on-chip calibration circuitry that overcomes process variation across components. This enables the WLAN transceiving integrated circuit 450 to be used in high volume applications.

The WLAN transceiving integrated circuit 450 parallel I/O interface 324 (coupled to the BBC 452 via an I/O port 464) can be operated in either Master or Slave mode. By default the WLAN transceiving integrated circuit 400 will power up in one of the modes depending on the setting of MODE pins (not shown). In Master mode, the WLAN transceiving integrated circuit 450 accesses peripheral devices on the parallel bus 324 in (1) 8-bit parallel I/O Normal A0 Read and Write modes; and (2) 8-bit parallel I/O Fast ALE Read and Write modes. In Slave mode, the parallel I/O bus interface 464 is intended to support a connection to a wide range of external host processors or external host controllers. Data transfer between an external host 322 and the BBC 452 is provided through transmitter and receiver FIFOs. The external host 322 can program and monitor the FIFO control and status registers. There are also additional external host accessible registers to provide the external host with abilities to dynamically configuring, controlling, and diagnosing the Bluetooth device. The Slave mode interface timing of the parallel bus 324 can be in one of: (1) 8-bit parallel I/O Normal A0 Read and Write modes; (2) 8-bit parallel I/O Fast A0 Read and Write modes; and (3) 8-bit parallel I/O Fast ALE Read and Write modes.

The asynchronous serial interface I/O 320 (coupled to the BBC 452 via an asynchronous serial port 462) enables an asynchronous serial data stream to communicate with the BBC 452 in a similar fashion as the slave mode parallel I/O interface. A programmable baud rate generator is provided to select, transmit and receive clock rates from 9600 bps to 921.6 Kbps. The default baud rate is determined by the setting of external selection pins BAUD[3:0] (not shown).

A master mode 2-wire serial interface bus is available on the WLAN transceiving integrated circuit 450 to allow read and write operations from/to an I2C serial EEPROM 309 via the I2C interface 466 and the I2C connection 468. The BBC 452, via software instruction at power-on reset, sets the control of the I2C pins. At power-on reset the boot code that resides on the BBC 452 on-chip boot ROM monitors a controlled pin to determine the presence or absence of the serial EEPROM 309. If an EEPROM 309 is detected, the BBC 452 on chip boot code performs read operations from the EEPROM 309 that contains the fully operational microcode for the BBC 452. If the EEPROM 309 is not present, the BBC 452 expects the microcode to be downloaded from the external host. When the fully operational microcode is up and running, the external host can access the serial EEPROM 309 through an EEPROM Status and Control register. The BBC 452 implements all the high-level time critical Link Management functions in dedicated hardware under the control of the micro-sequencer. The BBC 452 hardware processes Bluetooth Link Control (LC) functions and manages Bluetooth slot usage. The external host 322 can use this register to manipulate the device pins in order to read and modify the EEPROM 309 contents as desired. The WLAN transceiving integrated circuit further includes power management functions 474 and Built-In-Self Test 472 functions. The power management-unit 474 provides power management features that are controlled through setting of the power management registers.

Figure 5:
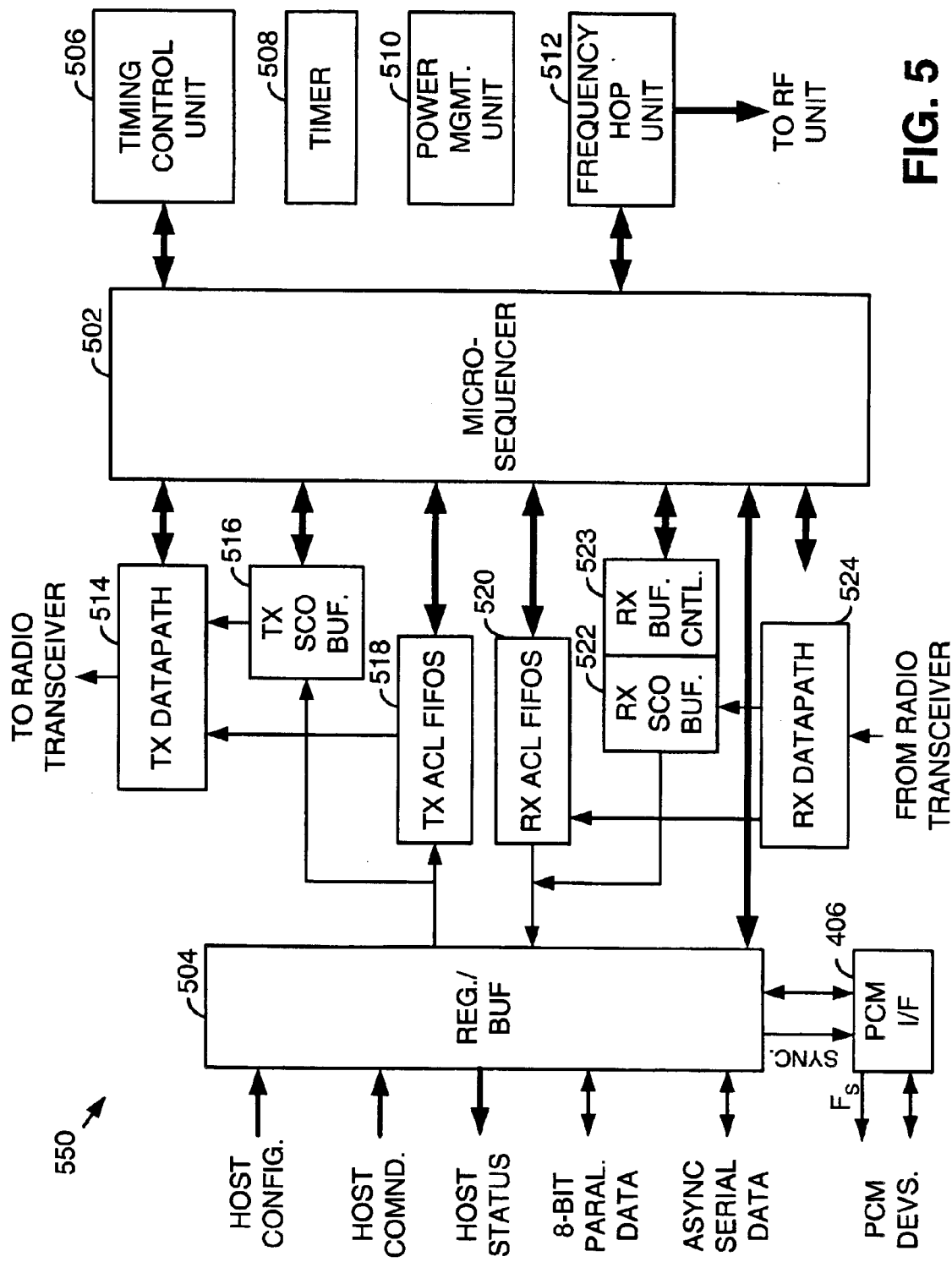
FIG. 5 is a block diagram illustrating the components of a Baseband Core of the WLAN transceiving integrated circuit constructed according to the present invention of FIGS. 4A and 4B.

FIG. 5 is a block diagram illustrating the components of a Baseband Core (BBC) 550 of the WLAN transceiving integrated circuit constructed according to the present invention of FIGS. 4A and 4B. The BBC 550 includes a microsequencer (processor) 502, a timing control unit 506, a timer 508, a power management unit 510, and a frequency hop unit 512. I the transmit path, the BBC 404 includes a TX data path 514 that couples to the radio transceiver, a TX SCO buffer (output buffer) 516, and TX ACL FIFOs 518. In the receive path, the BBC 550 includes an RX data path 524 that couples to the radio transceiver, an RX SCO input buffer 522, and an RX ACL FIFO 520. These components service the receive path for the BBC 550. The registers/buffers 504 receive external host configuration data, external host command data, provide status to the external host, and interface with the external host via the parallel and serial buses. The registers/buffers 504 also interface with the audio CODEC 314 via a PCM interface 406. An input buffer controller 523 operably couples to the input buffer 522 and to the processor 502.

Figure 6:
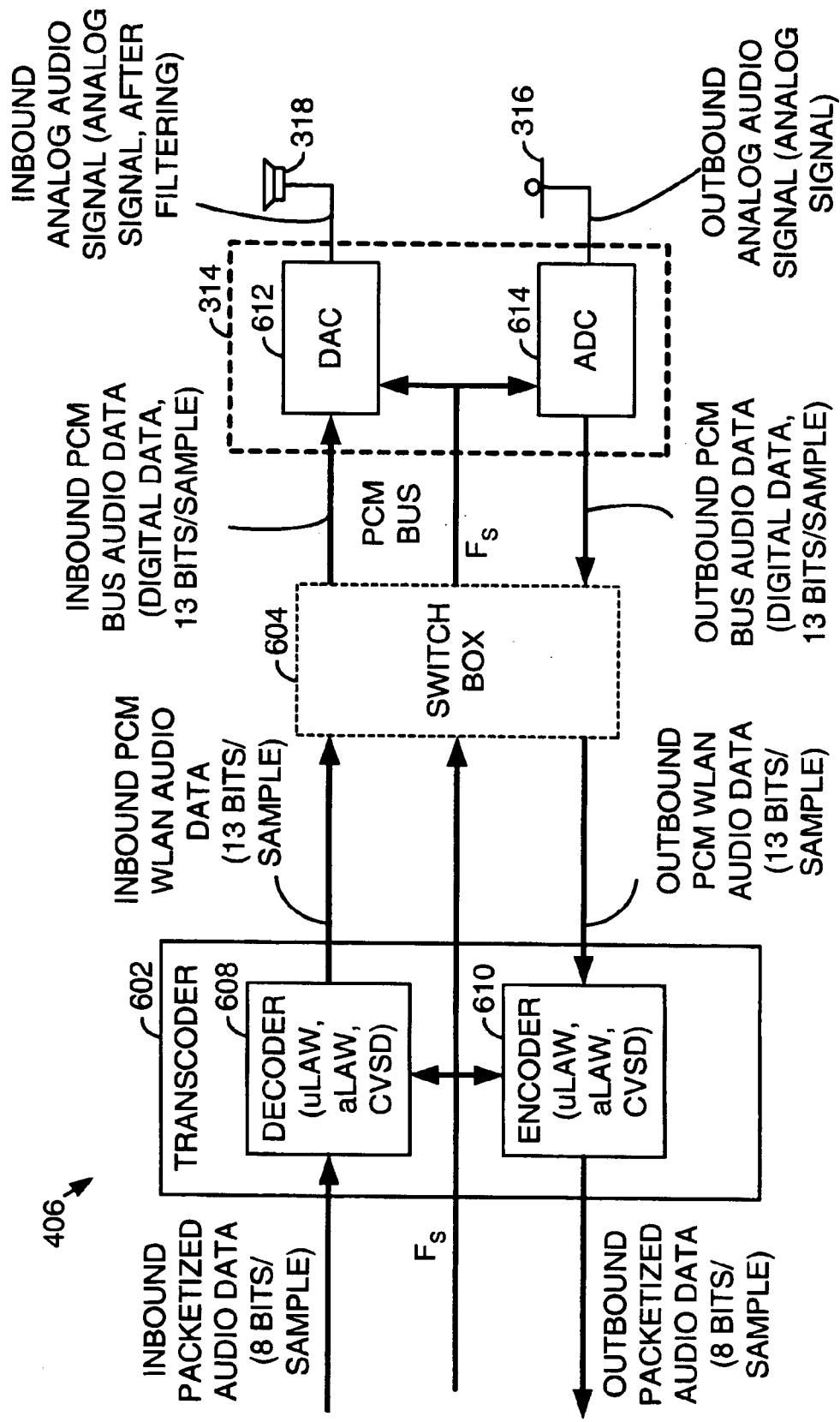
FIG. 6 is a block diagram generally illustrating the components of a Pulse Code Modulated (PCM) interface of the Baseband Core of FIG. 5.

FIG. 6 is a block diagram generally illustrating the components of a Pulse Code Modulated (PCM) interface 406 of the Baseband Core 550 of FIG. 5. The PCM interface 406 includes a transcoder 602 having a decoder 608 and an encoder 610, a switch box 604 and an audio CODEC 314. Coupled to the audio CODEC 314 are a speaker 318 and a microphone 316. As shown, the audio CODEC 314 includes a Digital-to-Analog-Converter (DAC) 614 that converts PCM audio data to an analog audio signal and provides the analog audio signal to a speaker 318. Further, as is shown, the audio CODEC 314 includes an Analog-to-Digital-Converter (ADC) 614 that receives an analog audio signal from the coupled microphone 316 and converts the analog audio signal to PCM audio data.

The transcoder 602 converts packetized audio data (encoded) that is suitable for the WLAN interface to PCM audio data that is suitable for the audio CODEC 314, and vice versa. In particular, the decoder 608 converts encoded packetized audio data to PCM audio data while the encoder 610 converts PCM audio data to encoded packetized audio data. In one embodiment, the transcoder 602 supports 13-bit linear PCM CODEC devices with a 2's complement serial data format. It is capable of supporting an external audio clock or outputting an audio clock (ACLK) in multiples of 128 KHz, from 128 KHz to 4096 KHz. In an audio master mode, the PCM I/F 406 can generate PCM audio data in an 8 KHz short/long Frame Sync (ASYNC) format. In an audio slave mode, the PCM I/F 406 can receive PCM audio data in an 8 KHz short Frame Sync format.

The PCM I/F 406 supports up to three SCO channels, and in at least one embodiment, the PCM audio data is Time Division Multiplexed (TDM) into slots within every ASYNC period. Each of the three SCO channels can be assigned to any TDM slot. The TDM slots can be programmed from one to 16 slots depending on the ACLK rate. In PCM Master mode, and for systems that don't support TDM, the two additional SCO channels are available using GPIO6 and GPIO7 as the PCM Frame Sync signals (i.e., ASYNC3 and ASYNC2, respectively).

The transcoder 602 can process each SCO channel with A-law operations, $\mu$-law operations, or Continuous Variable Slope Delta (CVSD) operations. The appropriate voice-coding scheme is selected after negotiations between the Link Managers of the communicating WLAN devices. On the Bluetooth air-interface, either a 64 kb/s log PCM format (A-law or $\mu$-law) is used, or a 64 kb/s CVSD is used. The latter format applies an adaptive delta modulation algorithm with syllabic companding. The voice coding on the PCM I/F 406 should have a quality equal to or better than the quality of 64 kb/s log PCM. Since the voice channels on the air-interface can support a 64 kb/s information stream, a 64 kb/s log PCM traffic can be used for transmission. Either A-law or $\mu$-law compression can be applied. In the event that the line interface uses A-law and the air interface uses $\mu$-law or vice versa, a conversion from A-law to $\mu$-law is performed. The compression method follows ITU-T recommendations G.711.

A more robust format for voice over the air interface is a delta modulation. This modulation scheme follows the waveform where the output bits indicate whether the prediction value is smaller or larger then the input waveform. To reduce slope overload effects, syllabic companding is applied: the step size is adapted according to the average signal slope. The input to the encoder 610 (when performing CVSD operations) is 64 kilo-samples/sec linear PCM. An optional on-chip voice switch box 604 of the PCM I/F 406 provides features such as N-ways conference calling, call forwarding, and call waiting.

Figure 7A:
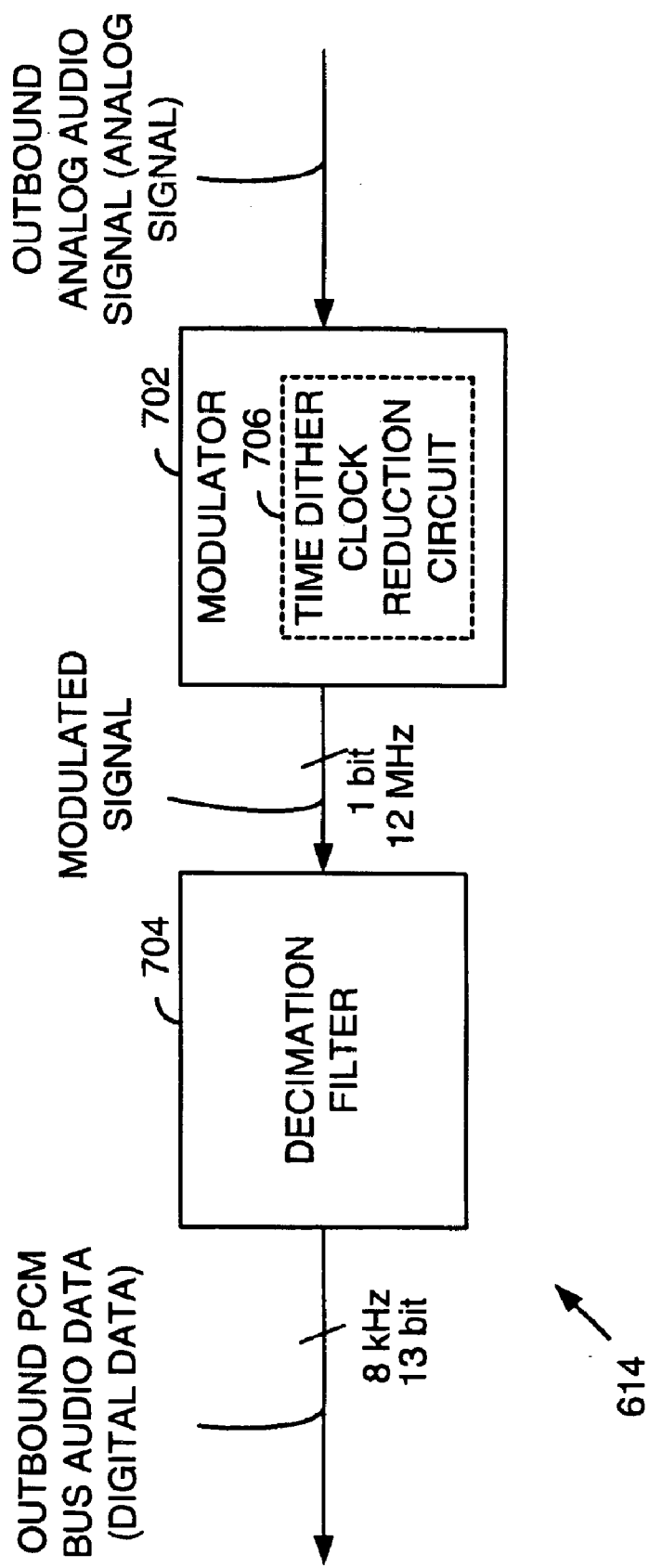
FIG. 7A is block diagram illustrating the components of an Analog-to-Digital Converter (ADC) of the COder/DECoder (CODEC) of FIG. 6 that is constructed according to the present invention.

FIG. 7A is block diagram illustrating the components of an Analog-to-Digital Converter (ADC) of the COder/DECoder (CODEC) of FIG. 6 that is constructed according to the present invention. The ADC 614 includes a modulator 702, e.g., sigma-delta, or delta-sigma modulator and decimation filter 704. The modulator 702 receives an outbound analog audio signal (analog signal) from a coupled microphone 316, for example. The modulator 702 modulates the analog audio signal to produce a modulated signal at a modulator clock rate of 12 MHz. The decimation filter 704 receives the modulated signal at the modulator clock rate of 12 MHz, performs decimation and filtering operations on the modulated signal, and produces the outbound PCM audio data (digital data). The decimation filter produces the outbound PCM audio data as a 13 bit signal at 8 kHz. According to the present invention, the modulator 702 includes a time dither clock reduction circuit 706. The operation of the time dither clock reduction circuit will be described in more detail with reference to FIG. 7B.

Figure 7B:
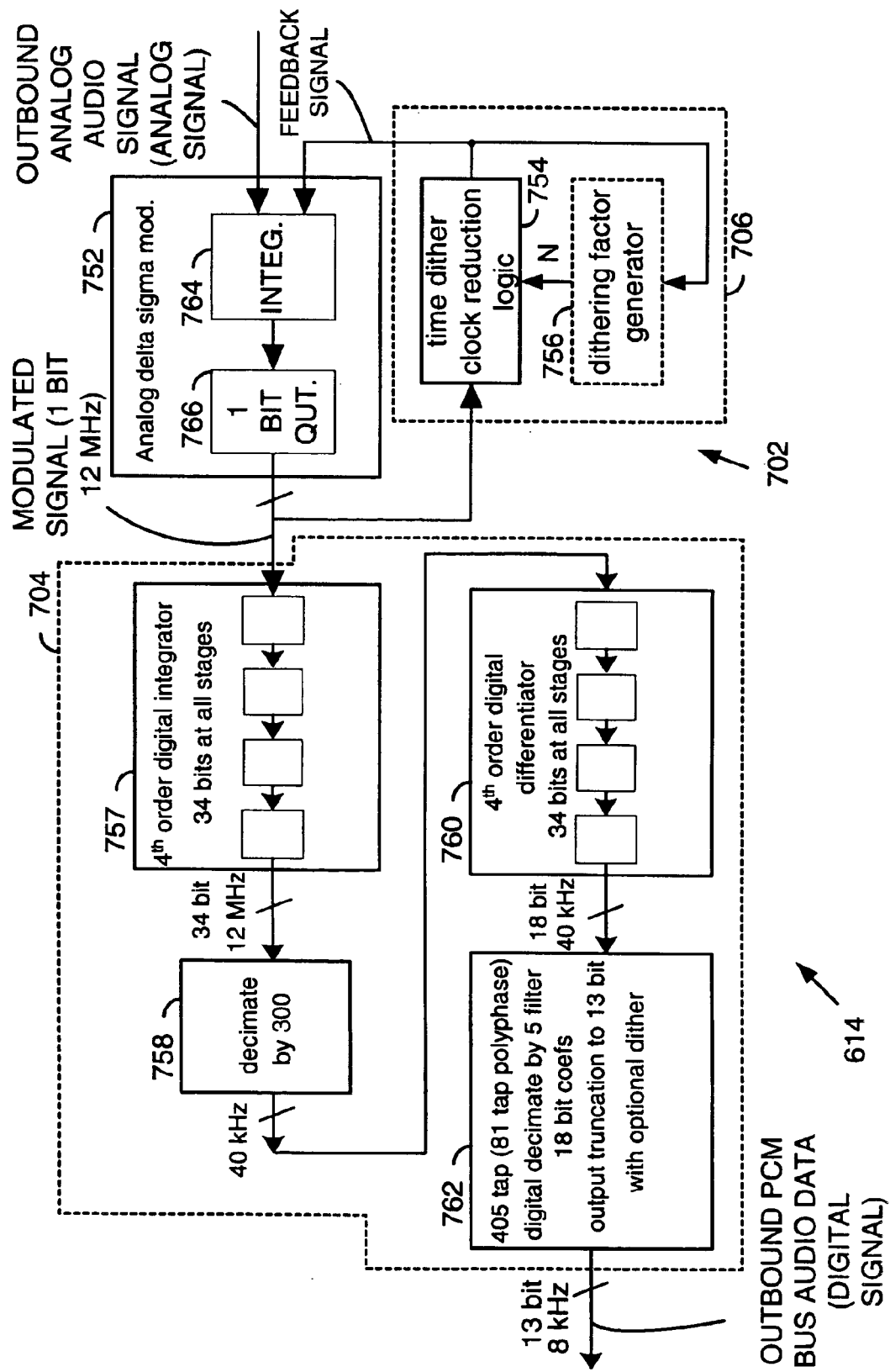
FIG. 7B is block diagram illustrating in more detail the ADC of FIG. 7A according to one embodiment of the present invention.

FIG. 7B is block diagram illustrating in more detail the ADC 614 of FIG. 7A according to one embodiment of the present invention. The modulator 702 of the ADC 614 includes an analog delta sigma modulator 752 and the time dither clock reduction circuit 706. The analog sigma delta modulator 752 includes an integrator 764 and a quantizer 766. In the embodiment of FIG. 7B, the quantizer 766 is a two level quantizer, e.g., produces the modulated signal at levels of logic 0 and logic 1. However, in other embodiments, a three level quantizer or a more than three level quantizer may be employed. The time dither clock reduction circuit 706 includes time dither clock reduction logic 754 and an optional dithering factor generator 756.

The integrator 764 receives as its inputs the analog signal and a feedback signal from the time dither clock reduction circuit 704. The quantizer 766 receives the output of the integrator 714 and produces the modulated signal at the modulator clock rate of 12 MHz. The time dither clock reduction circuit 704 receives the modulated signal from the quantizer 716 and produces the feedback signal to the integrator 764. The operation of the time dither clock reduction logic 754 will be described with particular reference to FIGS. 9 and 10. The operation of the dithering factor generator 756 will be described with particular reference to FIG. 11.

The decimation filter 704 includes a $4^{th}$ order digital integrator 757, a decimator 758, a $4^{th}$ order digital differentiator 760, and a decimation filter 762. The modulated signal the modulator clock rate of 12 MHz produced by the quantizer 766 is also received by the $4^{th}$ order digital integrator 757 that produces a 34 bit output at 12 MHz. The $4^{th}$ order digital integrator 757 produces 34 bits at each of its stages. The decimator 758 receives the 34 bit output at 12 MHz from the $4^{th}$ order digital integrator 757 and produces a 34 bit output at 40 kHz. The $4^{th}$ order digital integrator 760 receives the 34 bit output at 40 kHz from the decimator 758 and produces an 18 bit output at 40 kHz. The decimation filter 762 receives the 18 bit output at 40 kHz from the $4^{th}$ order digital integrator 760 and produces the 13 bit signal at 8 kHz outbound PCM audio data (digital signal).

FIG. 8A is block diagram illustrating the components of the DAC 612 of the CODEC 314 of FIG. 6 that is constructed according to the present invention. The DAC 612 includes an interpolation filter 802 and a modulator 804. The interpolation filter 802 receives inbound PCM audio data (digital data) that includes 13 bits per sample at a rate of 8 kHz. The interpolation filter 802 interpolates and filters the inbound PCM audio data to produce an interpolated and filtered digital signal (18 bit output at 12 MHz). The modulator 804 receives the 18 bit 12 MHz interpolated and filtered digital signal and modulates the interpolated and filtered digital signal to produce the modulated signal. The modulated signal, after filtering and smoothing is the analog signal that is presented to the speaker 318 illustrated in FIG. 6. According to the present invention, the modulator 802 includes a time dither clock reduction circuit 806.

FIG. 8B is block diagram illustrating in more detail the modulator 804 of the DAC 612 of FIG. 8A according to one embodiment of the present invention. A noise shaping network 850 of the modulator 804 receives the 18 bit 12 MHz interpolation filter output and produces a 23 bit noise shaped digital signal. A quantizer 852 of the modulator 804 receives the 23 bit noise shaped digital signal, quantizes the 23 bit noise shaped digital signal (to two or more levels), and produces the modulated signal having two (or more) quantization levels at a modulator clock rate. The time dither clock reduction circuit 806 receives the modulated signal and performs clock reduction and time dithering operations upon the modulated signal to produce a time dithered/clock reduced modulated signal. The time dithered/clock reduced modulated signal is then filtered and smoothed to produce the analog signal. The time dithered/clock reduced modulated signal also serves as a feedback signal to the noise shaping network 850.

Figure 8C:
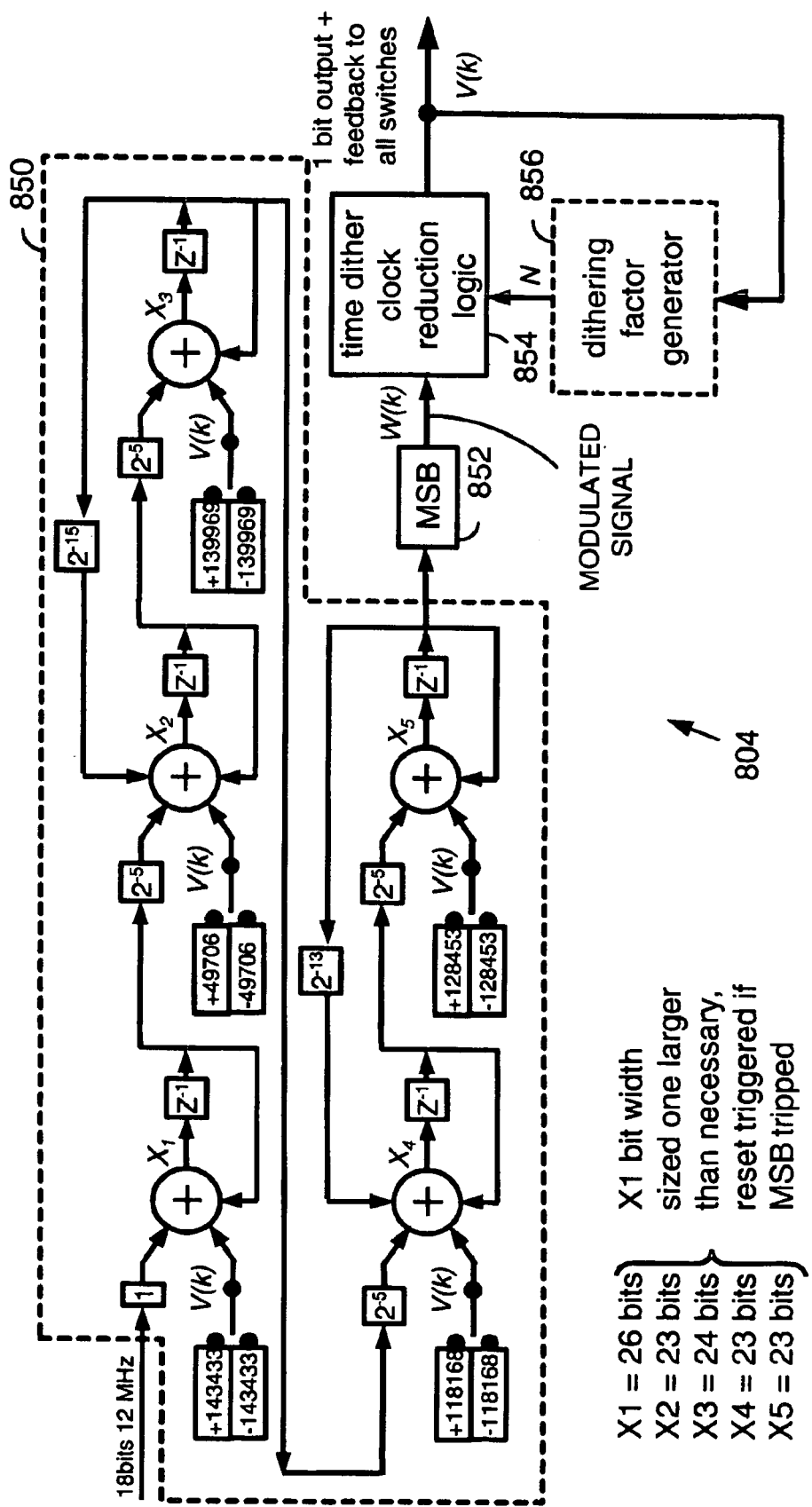
FIG. 8C is a block diagram illustrating in more detail still the modulator of the DAC of FIG. 8A according to an embodiment of the present invention.

FIG. 8C is a block diagram illustrating in more detail still the modulator 804 of the DAC 612 of FIG. 8A according to an embodiment of the present invention. As is shown, the noise shaping network 850 includes a plurality of digital filtering components. The quantizer includes a Most Significant Bit(s) (MSB) circuit 852 that receives the output from the noise shaping network 852. The time dither clock reduction circuit 806 includes time dither clock reduction logic 854 and an optional dithering factor generator 856. The output of the MSB circuit 852 is received by the time dither clock reduction logic 854. The output of the time dither clock reduction logic 854 is the time dithered/clock reduced modulated signal that serves as the inbound analog audio signal (after optional filtering), as a feedback signal to control the state of all feedback switches of the noise shaping network 850, and as input to the dithering factor generator 856.

Figure 9:
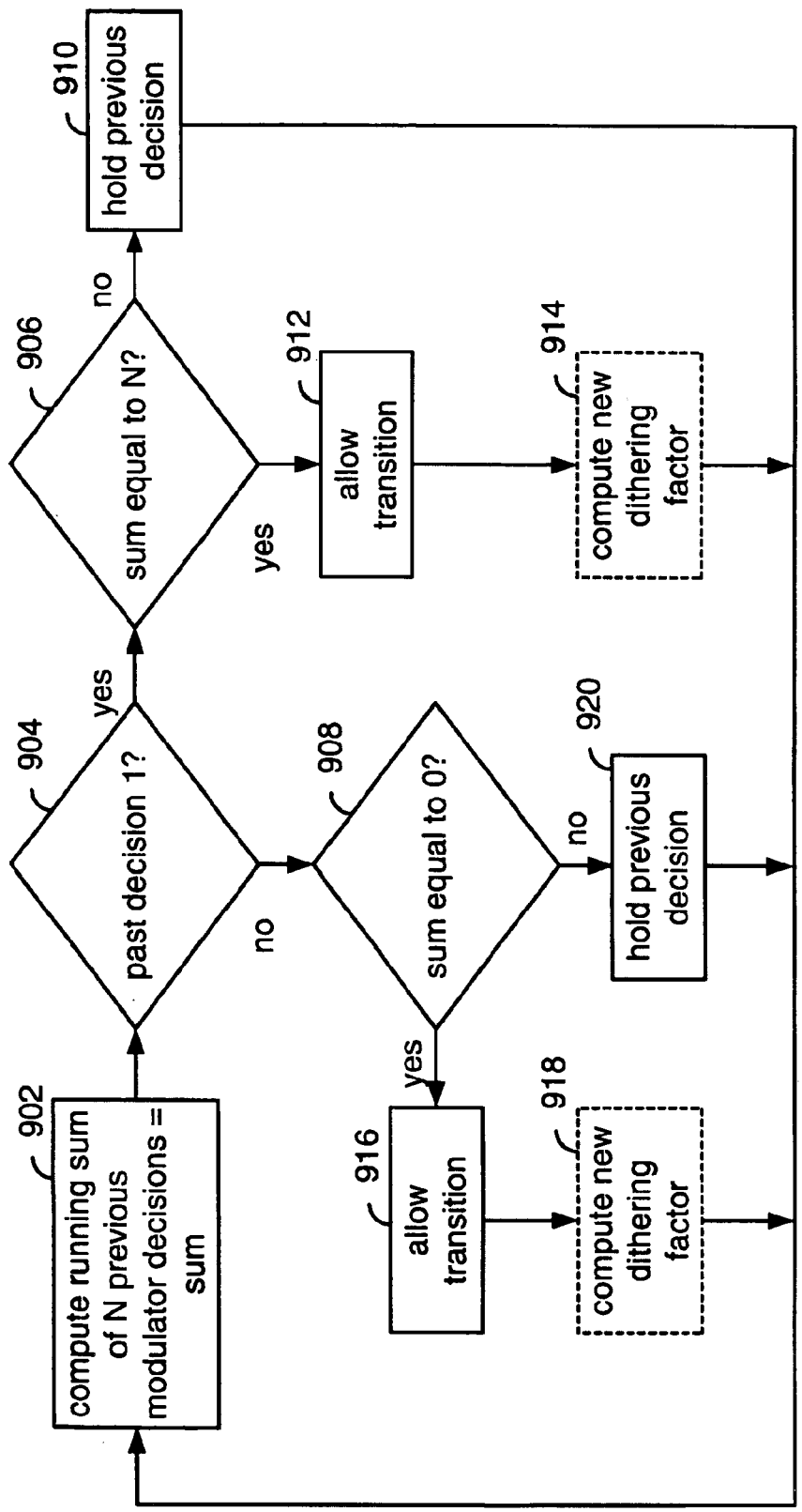
FIG. 9 is a logic diagram illustrating operation of the time dither clock reduction circuit of the ADC of FIGS. 7A and 7B and of the time dither clock reduction circuits of the DAC of FIGS. 8A, 8B, and 8C according to the present invention for a two level quantizer.

FIG. 9 is a logic diagram illustrating operation of the time dither clock reduction circuit 706 of the ADC 614 of FIGS. 7A and 7B and of the time dither clock reduction circuit 806 of the DAC 612 of FIGS. 8A, 8B, and 8C according to the present invention for a two level quantizer. The time dither clock reduction circuit 706 of the ADC 614 operates to somewhat randomize the feedback signal provided to the modulator 702 of the ADC 614 while retaining the single bit resolution of the output of the modulator 702, i.e., the clock of the modulator 702—12 MHz. The time dither clock reduction circuit 806 of the DAC 612 operates to somewhat randomize the duration between transitions of the output of the DAC 612 and also to somewhat randomize the feedback provided to the noise shaping network 850 of the modulator 804 while maintaining a time resolution equal to the modulator clock rate.

In each of these implementations of the output of the time dither clock reduction circuits 706 and 806 are inhibited from transitioning any faster than N modulator clock cycles, i.e., N cycles of the 12 MHz modulator clock rate of the embodiments described. Further, the time dither clock reduction circuits 706 and 806 introduce time dithering as well by using a running sum of the past N outputs of the respective modulator, e.g., V(k) of modulator 804. For a 2 level quantizer, which uses levels 1 and 0, the following algorithm may be employed:

At every modulator clock cycle, compute

```
sum = sum − V(k−N−1) + V(k−1)
if (V(k−N) == 1 & sum != N) or (V(k−N) == 0 & sum != 0) then
    V(k) = V(k−1)
        else
    V(k) = msb(X5) (transition possible)
end if
```

This algorithm is implemented in FIG. 9 by first computing the running sum of N previous modulator decisions (the "sum" at step 902). If the past decision of the time dither clock reduction circuit was a "1" (as determined at step 904), it is next determined whether the sum is equal to N (step 906). If the sum is not equal to N, the previous output of the time dither clock reduction circuit V(k) is held (step 910). If the sum is equal to N, the output of the time dither clock reduction circuit V(k) is allowed to transition (step 912). Thus, if the past N modulated signals were 1, and the current modulated signal is 0, the time dither clock reduction circuit V(k) is allowed to transition from a 1 to a 0. Further, if the output of the time dither clock reduction circuit is allowed to transition at step 912, a new dithering factor (value of N) is optionally determined (step 914). The manner in which the dithering factor N is determined will be described with particular reference to FIG. 11.

If the past decision of the time dither clock reduction circuit was a 0 (as determined at step 904), it is next determined whether the sum is equal to 0 (step 908). If the sum is not equal to 0, the previous output of the time dither clock reduction circuit V(k) is held (step 920). If the sum is equal to 0, the output of the time dither clock reduction circuit V(k) is allowed to transition (step 916). Thus, if modulated signal is a 1 for the current modulator clock cycle, the output of the time dither clock reduction circuit V(k) will transition from a 0 to a 1. Further, if the output of the time dither clock reduction circuit is allowed to transition at step 916, a new dithering factor (value of N) is optionally determined (step 914). From each of steps 910, 914, 918, and 920, operation returns to step 902 where the steps of FIG. 9 are repeated for the next clock cycle.

With the time dithering and clock reduction operations of the present invention, single modulator clock cycle resolution is maintained at the output of the time dither clock reduction circuits 706 or 806. Single modulator clock cycle resolution at the output of the DAC 612 results in a more accurate production of the analog audio signal. Single modulator clock cycle resolution at the time dither clock reduction circuit 706 of the modulator 702 of the ADC 614 causes the modulator to better track the analog input signal. Further, by limiting the transitions of the time dither clock reduction circuit 706 or 806, power consumption of the ADC 614 and DAC 612 are reduced. Moreover, by adding time dithering, the ADC 614 and DAC 612 produce less output noise in the form of tones, i.e., frequencies corresponding to a fixed clock reduction operation. Reduction in output noise also lowers Electromagnetic Interference to address FCC and radio issues.

Figure 10:
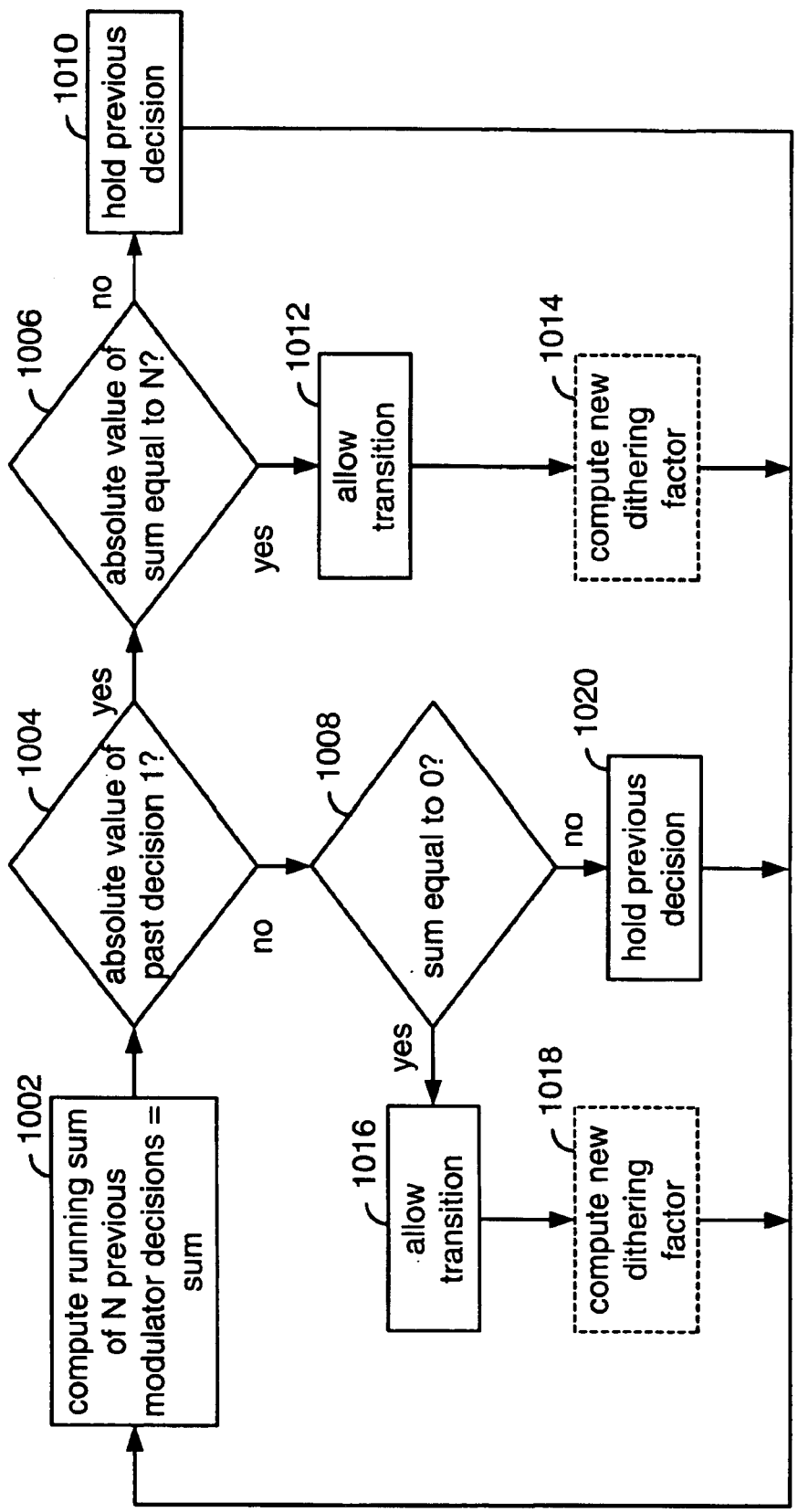
FIG. 10 is a logic diagram illustrating operation of the time dither clock reduction circuit of the ADC of FIGS. 7A and 7B and of the time dither clock reduction circuits of the DAC of FIGS. 8A, 8B, and 8C according to the present invention for a three level quantizer.

FIG. 10 is a logic diagram illustrating operation of the time dither clock reduction circuit of the ADC of FIGS. 7A and 7B and of the time dither clock reduction circuits of the DAC of FIGS. 8A, 8B, and 8C according to the present invention for a three level quantizer. With the three level quantizer, the 3 level modulator output and feedback signal feedback V(k) is inhibited from transitioning any faster than N clocks. The 3 level quantizer modulator uses levels 1, 0 and −1.

Thus, for the three level quantizer, at every clock, compute

```
sum = sum − V(k−N−1) + V(k−1)
if (|V(k−N)| == 1 & |sum| != N) or (V(k−N) == 0 & sum != 0) then
    V(k) = V(k−1)
        else (3 level transition possible)
        if X5 > thresh
            V(k) = 1
        else if X5 < −thresh
            V(k) = −1
        else
            V(k) = 0
        end if
end if
```

This algorithm is implemented in FIG. 10 by first computing the running sum of N previous modulator decisions (the "sum" at step 1002). If the absolute value of the past decision of the modulator was a "1" (as determined at step 1004), it is next determined whether the absolute value of the sum is equal to N (step 1006). If the absolute value of the sum is not equal to N, the previous output of the time dither clock reduction circuit V(k) is held (step 1010). If the sum is equal to N, the output of the time dither clock reduction circuit V(k) is allowed to transition with the modulated signal (step 1012). Further, if the output of the time dither clock reduction circuit is allowed to transition at step 1012, a new dithering factor (value of N) is optionally determined (step 1014). The manner in which the dithering factor N is determined will be described with particular reference to FIG. 11.

If the absolute value of the past decision of the modulator was not a 1 (as determined at step 1004), it is next determined whether the sum is equal to 0 (step 1008). If the sum is not equal to 0, the previous output of the time dither clock reduction circuit V(k) is held (step 1020). If the sum is equal to 0, the output of the time dither clock reduction circuit V(k) is allowed to transition with the modulated signal (step 1016). Further, if the output of the modulator is allowed to transition at step 1016, a new dithering factor (value of N) is optionally determined (step 1014). From each of steps 1010, 1014, 1018, and 1020, operation returns to step 1002 where the steps of FIG. 10 are repeated for the next clock cycle.

Figure 11:
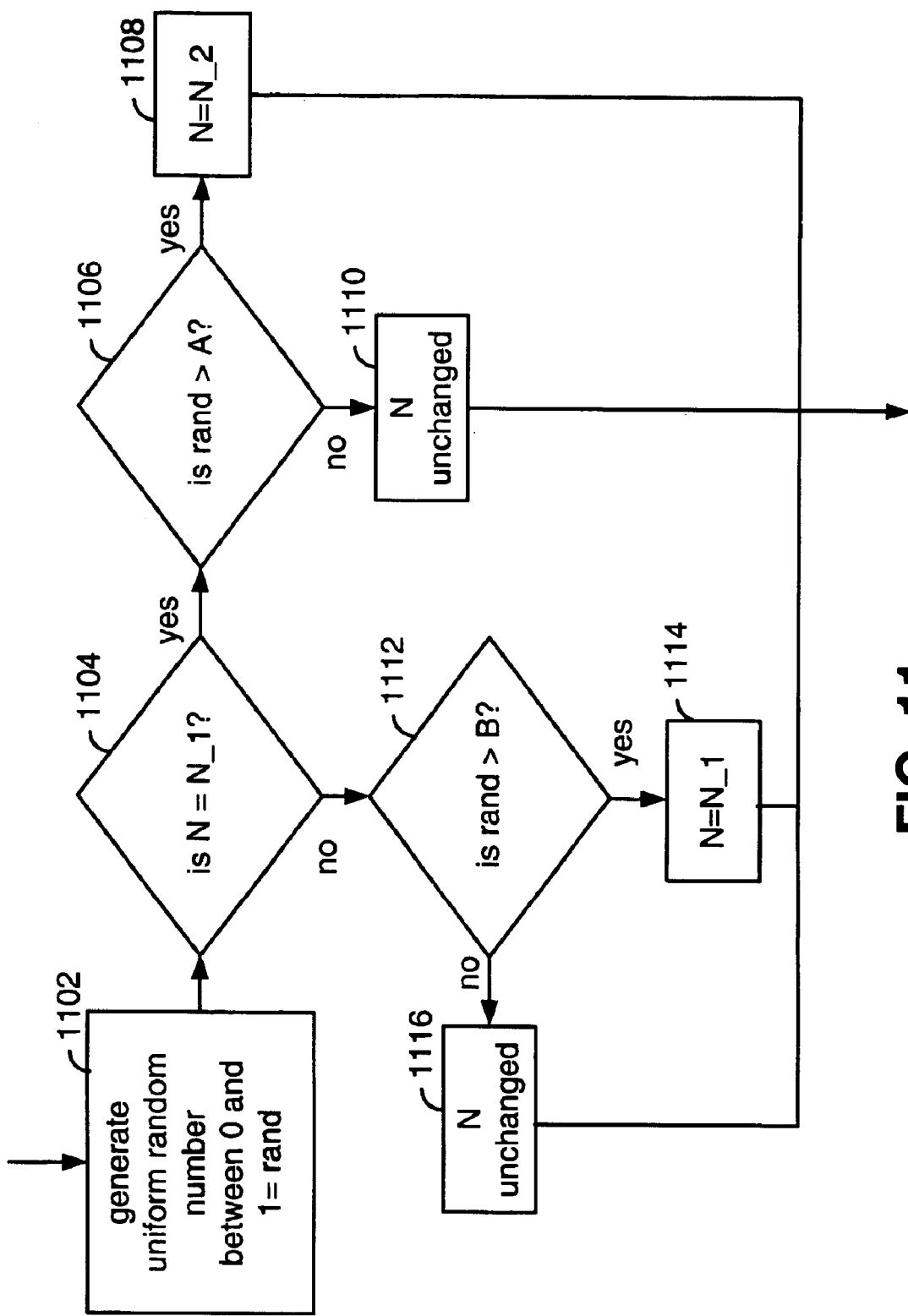
FIG. 11 is a logic diagram illustrating operation of the dithering factor generator of the time dither clock reduction circuits of the ADC of FIGS. 7A and 7B and of the time dither clock reduction circuits of the DAC of FIGS. 8A, 8B, and 8C.

FIG. 11 is a logic diagram illustrating operation of the dithering factor generator of the time dither clock reduction circuits of the ADC of FIGS. 7A and 7B and of the time dither clock reduction circuits of the DAC of FIGS. 8A, 8B, and 8C. The purpose of adjusting the dithering factor N is to allow time dither to be added to the modulator transitions. This advantage is not possible using amplitude dither. Time dither can be added in precisely controlled amounts using the principles of the present invention.

In the embodiment of the present invention in determining a dithering factor, The clock reduction circuit is allowed to randomly switch between two dithering factors N_1 and N_2. By changing the values of the dithering factor N at some modulator output transitions, a satisfactory degree of randomness is achieved. In other embodiments more than two dithering factors may be used. As was explained in the operations of FIG. 9 and FIG. 10, the dithering factor is adjusted only after the time dither clock reduction logic 754 or 854 has allowed the modulator output to transition (at step 914 or 918 of FIG. 9 and at step 1014 or 1018 of FIG. 10).

One technique for determining a dithering factor includes first generating a random number between 0 and 1 (rand at step 1102). Then, it is determined whether the prior dithering factor N is equal to N_1, one of two dithering factors, N_1 and N_2, employed (at step 1104). If N=N_1, it is next determined whether rand is greater than A (step 1106). The value of A is chosen as 0.1 in the embodiment of FIG. 11. If rand is greater than A, the dithering factor N is set to N_2 for the next transition cycle (step 1108). However, if rand is not greater than A, the dithering factor N remains unchanged for the subsequent transition cycle (step 1110).

If N is not equal to N_1 (as determined at step 1104), it is next determined whether rand is greater than B (step 1112). The value of B is chosen as 0.9 in the embodiment of FIG. 11. If rand is greater than B, the dithering factor N is set to N_1 for the next transition cycle (step 1114). However, if rand is not greater than B, the dithering factor N remains unchanged for the subsequent transition cycle (step 1116). From each of steps 1108, 1110, 1114, and 1116, operation continues to step 902 of FIG. 9 or 1002 of FIG. 10.

Figure 12:
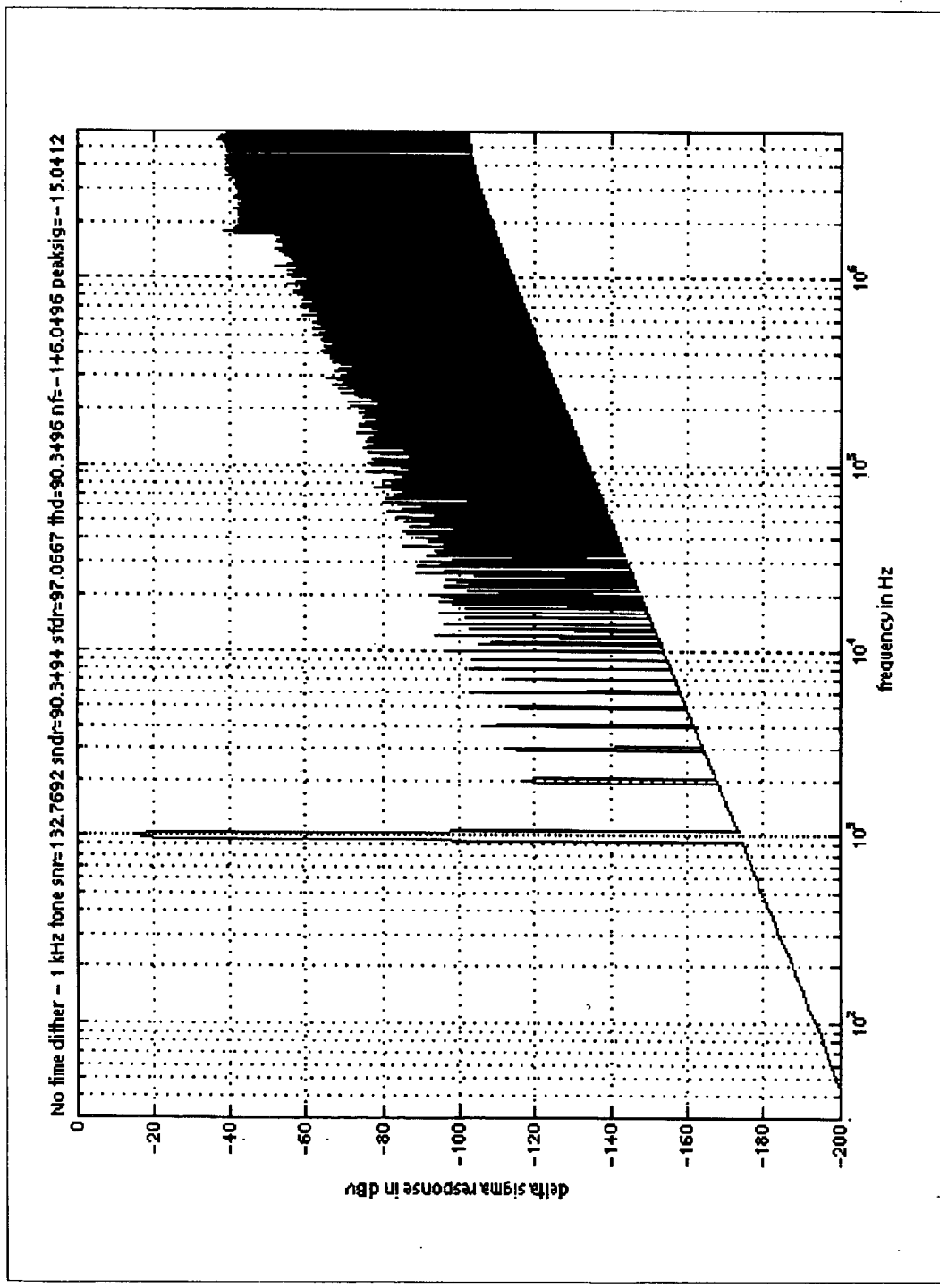
FIG. 12 is a graph illustrating the delta sigma response of a prior art ADC during quiet periods that includes a plurality of idle tones.

FIG. 12 is a graph illustrating the delta sigma response of a prior art ADC during quiet periods that includes a plurality of idle tones. As is illustrated, the prior art ADC exhibits significant tonal noise in both the audio range and in the EMI range.

Figure 13:
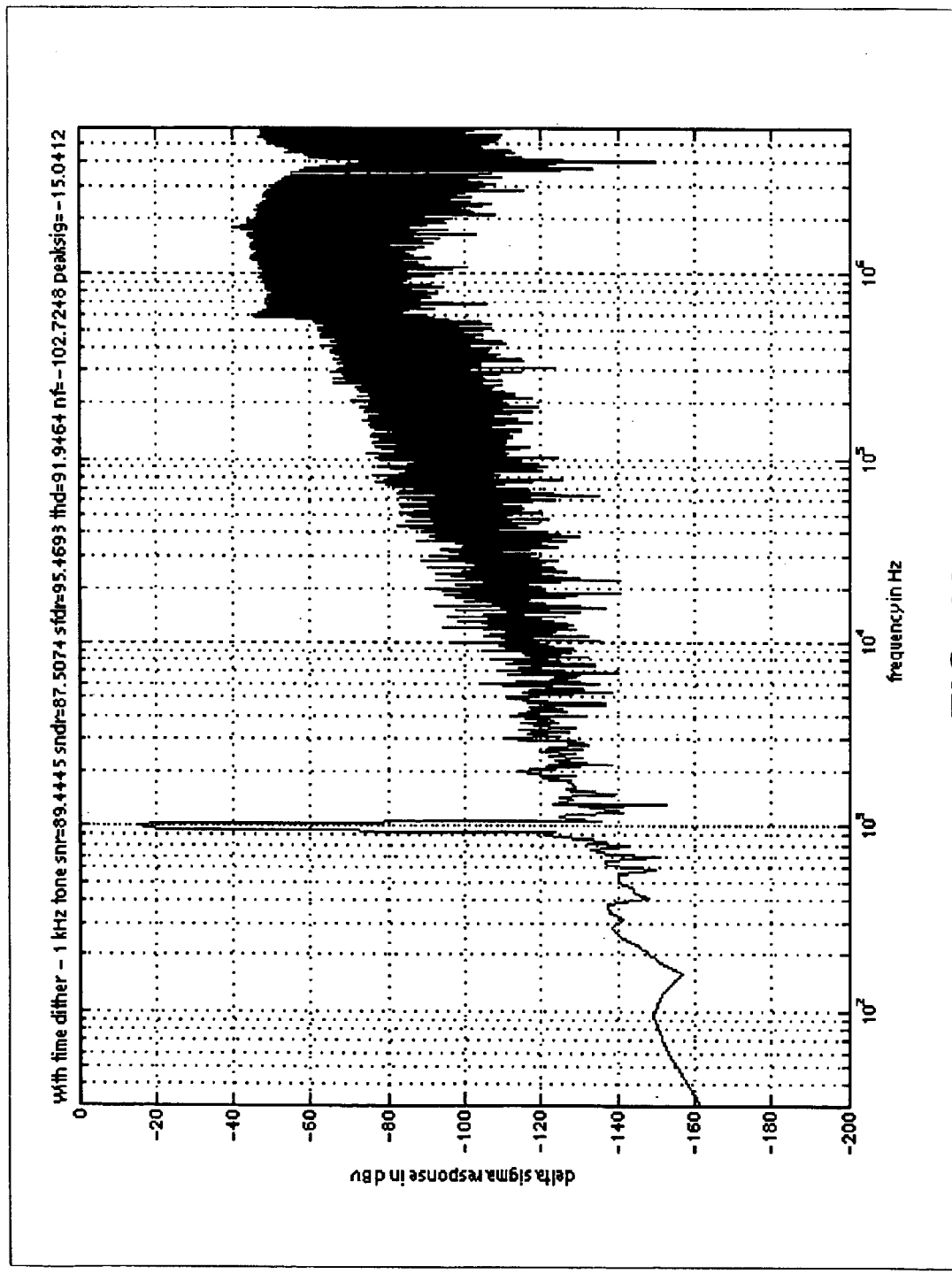
FIG. 13 is a graph illustrating the delta sigma response of an ADC constructed according to the present invention that illustrates the absence of idle tones during quiet periods.

FIG. 13 is a graph illustrating the delta sigma response of an ADC constructed according to the present invention that illustrates the absence of idle tones during quiet periods. The ADC of the present invention has significantly reduced tonal noise in both the audio range and in the EMI range as compared to the ADC whose response is illustrated in FIG. 12.

Figure 14:
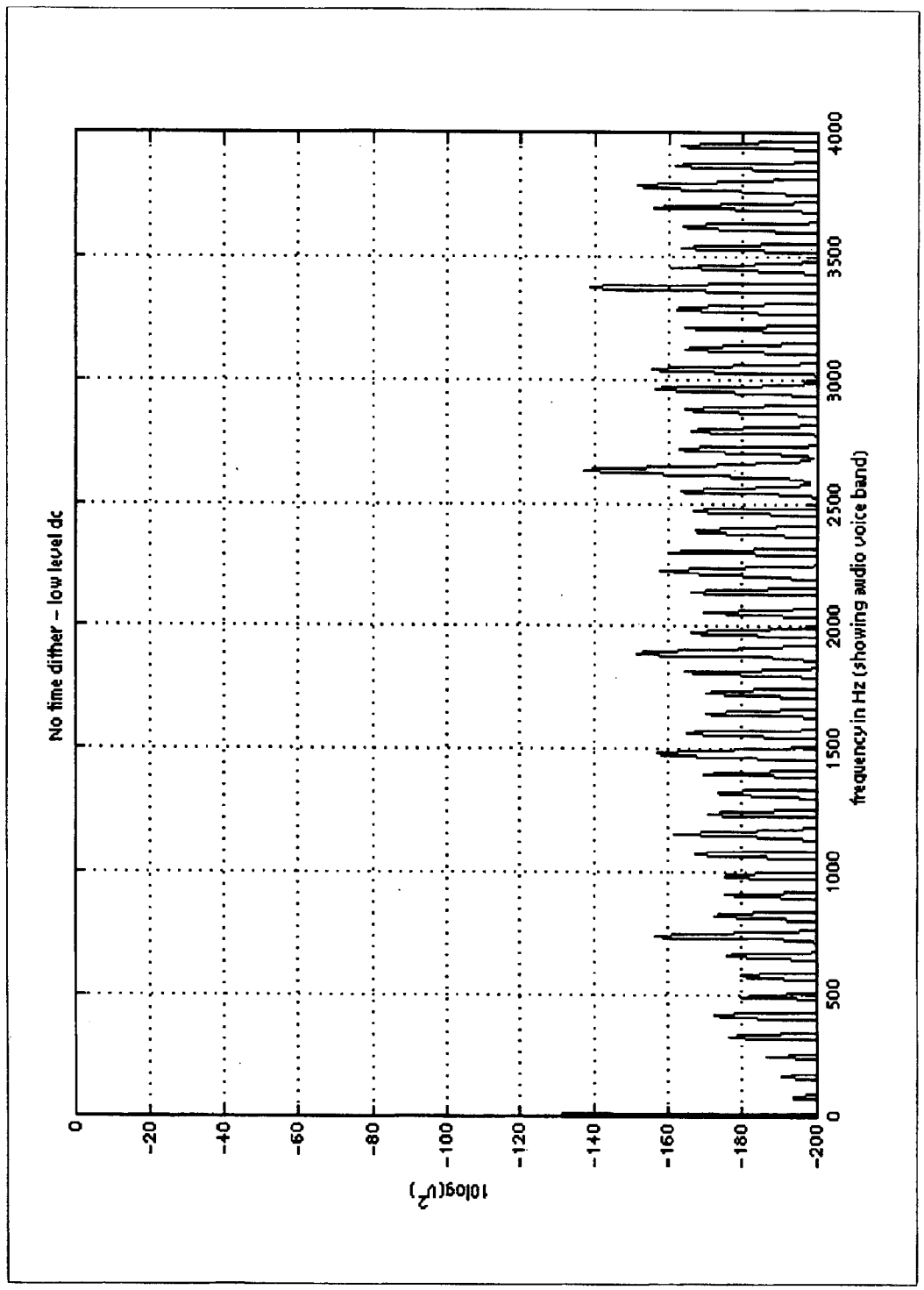
FIG. 14 is a graph illustrating the frequency response of a prior art ADC within the audio band that includes a plurality of idle tones produced when the ADC is stimulated by a low level DC input.

FIG. 14 is a graph illustrating the frequency response of a prior art ADC within the audio band that includes a plurality of idle tones produced when the ADC is stimulated by a low level DC input. As is illustrated, significant tonal noise exists.

Figure 15:
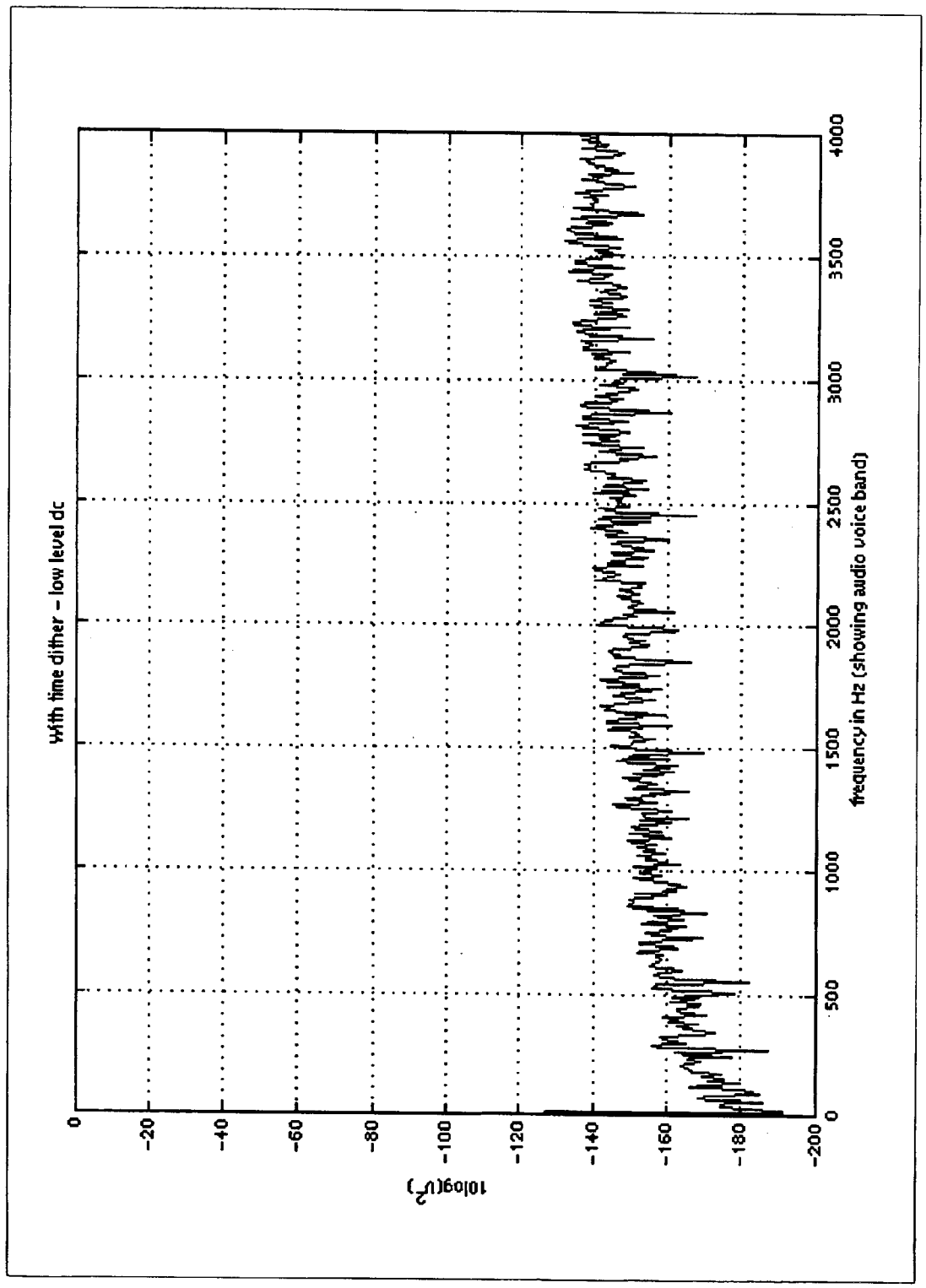
FIG. 15 is a graph illustrating the frequency response of an ADC constructed according to the present invention within the audio band when the ADC is stimulated by a low level DC input.

FIG. 15 is a graph illustrating the frequency response of an ADC constructed according to the present invention within the audio band when the ADC is stimulated by a low level DC input. As contrasted to the ADC behavior illustrated in FIG. 14, tonal noise is significantly reduced in the audio band.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A COder/DECoder (CODEC) that converts an inbound analog signal to inbound packetized digital data and that converts outbound packetized digital data to an outbound analog signal, the CODEC comprising:
   a transcoder having an outbound portion that is operable to convert the outbound packetized digital data to outbound streamed digital data and an inbound portion that is operable to convert inbound streamed digital data to the inbound packetized digital data;
   a Digital to Analog Converter (DAC) coupled to the transcoder that is operable to convert the outbound streamed digital data to the outbound analog signal; and
   an Analog to Digital Converter (ADC) coupled to the transcoder that is operable to convert the inbound analog signal to the inbound streamed digital data, wherein the ADC includes;
      a modulator that is operable to receive the inbound analog signal and a feedback signal and to module the analog signal based upon the feedback signal to produce a modulated signal;
      a decimation filter coupled to the modulator that is operable to receive the modulated signal and to decimate and filter the modulated signal to produce the inbound streamed digital data; and
      a time dither clock reduction circuit that is operable to produce the feedback signal by applying both clock reduction and time dithering to the modulated signal.

2. The CODEC of claim 1, wherein the CODEC services a wireless device.

3. The CODEC of claim 1, wherein:
   the modulator comprises an analog delta sigma block having an integrator and a quantizer;
   the integrator is operable to receive the inbound analog signal and the feedback signal and to produce an integrator output; and
   the quantizer is operable to receive the integrator output and to produce the modulated signal.

4. The CODEC of claim 1, wherein the CODEC operates upon audio information.

5. The CODEC of claim 1, wherein the decimation filter comprises at least one integrator, at least one decimator, and at least one digital filter.

6. The CODEC of claim 1, wherein the CODEC services a battery powered, hand-held device.

7. The CODEC of claim 1, wherein the transcoder implements at least one of A-law coding/decoding operations, µ-law coding/decoding operations, and Continuous Variable Slope Delta (CVSD) coding/decoding operations.

8. A wireless network device comprising:
   an antenna;
   a radio transceiver coupled to the antenna;
   a baseband processor coupled to the radio transceiver; and
   a COder/DECoder (CODEC) coupled to the baseband processor that is operable to convert an inbound analog signal to inbound packetized digital data and to convert outbound packetized digital data to an outbound analog signal, the CODEC comprising;
      a transcoder having an outbound portion that is operable to convert the outbound packetized digital data to outbound streamed digital data and an inbound portion that is operable to convert inbound streamed digital data to the inbound packetized digital data;
      a Digital to Analog Converter (DAC) coupled to the transcoder that is operable to convert the outbound streamed digital data to the outbound analog signal; and
      an Analog to Digital Converter (ADC) coupled to the transcoder that is operable to convert the inbound analog signal to the inbound streamed digital data, wherein the ADC includes:
         a modulator that is to receive the inbound analog signal and a feedback signal and to modulate the analog signal to produce a modulated signal;

a decimation filter coupled to the modulator that is operable to receive the modulated signal and to decimate and filter the modulated signal to produce the inbound streamed digital data; and a time dither clock reduction circuit that is operable to produce the feedback signal by applying both clock reduction and time dithering to the modulated signal.

9. The wireless network device of claim 8, wherein the radio transceiver supports Wireless Personal Area Network communications.

10. The wireless network device of claim 8, wherein:

the modulator comprises an analog delta sigma block having an integrator and a quantizer;

the integrator is operable to receive the inbound analog signal and the feedback signal and to produce an integrator output; and the quantizer is operable to receive the integrator output and to produce the modulated signal.

11. The wireless network device of claim 8, wherein the decimation filter comprises at least one integrator, at least one decimator, and at least one digital filter.

12. The wireless network device of claim 8, wherein the wireless network device supports Wireless Local Area Network communications.

13. The wireless network device of claim 8, wherein the transcoder of the CODEC implements at least one of A-law coding/decoding operations, $\mu$-law coding/decoding operations, and Continuous Variable Slope Delta (CVSD) coding/decoding operations.

14. A wireless headset comprising:

a frame;

an antenna coupled to the frame;

a radio transceiver coupled to the antenna;

a baseband processor coupled to the radio transceiver;

a COder/DECoder (CODEC) coupled to the baseband processor that is operable to convert an inbound analog signal to inbound packetized digital data and to convert outbound packetized digital data to an outbound analog signal, the CODEC comprising:

a transcoder having an outbound portion that is operable to convert the outbound packetized digital data to outbound streamed digital data and an inbound portion that is operable to convert inbound streamed digital data to the inbound packetized digital data;

a Digital to Analog Converter (DAC) coupled to the transcoder that is operable to convert the outbound streamed digital data to the outbound analog signal; and an Analog to Digital Converter (ADC) coupled to the transcoder that is operable to convert the inbound analog signal to the inbound streamed digital data, wherein the ADC includes;

a modulator that is operable to receive the inbound analog signal and a feedback signal and to modulate the analog signal to produce a modulated signal;

a decimation filter coupled to the modulator that is operable to receive the modulated signal and to decimate and filter the modulated signal to produce the inbound streamed digital data; and a time dither dock reduction circuit that is operable to produce the feedback signal by applying both clock reduction and time dithering to the modulated signal;

a speaker coupled to the frame and to the CODEC; and a microphone coupled to the frame and to the CODEC.

15. The wireless headset of claim 14, wherein the radio transceiver supports Wireless Personal Area Network communications.

16. The wireless headset of claim 14, wherein:

the modulator comprises an analog delta sigma block having an integrator and a quantizer;

the integrator is operable to receive the inbound analog signal and the feedback signal and to produce an integrator output; and the quantizer is operable to receive the integrator output and to produce the modulated signal.

17. The wireless headset of claim 14, wherein the decimation filter comprises at least one integrator, at least one decimator, and at least one digital filter.

18. The wireless headset of claim 14, wherein:

the modulator comprises an analog delta sigma block having an integrator and a quantizer;

the integrator is operable to receive the inbound analog signal and the feedback signal and to produce an integrator output; and the quantizer is operable to receive the integrator output and to produce the modulated signal.

19. The wireless headset of claim 14, wherein the transcoder of the CODEC implements at least one of A-law coding/decoding operations, $\mu$-law coding/decoding operations, and Continuous Variable Slope Delta (CVSD) coding/decoding operations.

20. The wireless headset of claim 14, wherein the radio transceiver supports at least one version of the Bluetooth Specification.

* * * * *

UNITED STATES PATENT AND TRADEMARK OFFICE
CERTIFICATE OF CORRECTION

PATENT NO. : 6,917,318 B2  
APPLICATION NO. : 10/731667  
DATED : July 12, 2005  
INVENTOR(S) : Russel Lambert Page 1 of 1

It is certified that error appears in the above-identified patent and that said Letters Patent is hereby corrected as shown below:

Column 16, line 10, in Claim 1: replace "includes;" with --includes:--

Column 16, line 12, in Claim 1: replace "module" with --modulate--

Column 18, line 4, in Claim 14: replace "includes;" with --includes:--

Signed and Sealed this

Twenty-ninth Day of July, 2008

JON W. DUDAS  
*Director of the United States Patent and Trademark Office*